(12) United States Patent
Ohkubo

(10) Patent No.: US 7,027,474 B2
(45) Date of Patent: Apr. 11, 2006

(54) SEMICONDUCTOR LASER DEVICE AND MANUFACTURING METHOD THEREOF

(75) Inventor: Nobuhiro Ohkubo, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 244 days.

(21) Appl. No.: 10/666,764

(22) Filed: Sep. 18, 2003

(65) Prior Publication Data

US 2004/0066822 A1 Apr. 8, 2004

(30) Foreign Application Priority Data

Sep. 27, 2002 (JP) ............................. 2002-283247

(51) Int. Cl.
*H01S 5/00* (2006.01)

(52) U.S. Cl. .................. 372/46.016; 372/46.01

(58) Field of Classification Search ............ 372/43.01, 372/45.01, 46.01, 46.016, 49.01
See application file for complete search history.

(56) References Cited

U.S. PATENT DOCUMENTS

| | | | |
|---|---|---|---|
| 5,018,158 A * | 5/1991 | Okada et al. ......... 372/46.016 |
| 5,089,437 A * | 2/1992 | Shima et al. .................. 438/40 |
| 5,343,486 A * | 8/1994 | Itaya et al. ............... 372/43.01 |
| 5,524,017 A * | 6/1996 | Endo ........................ 372/46.01 |
| 5,556,804 A | 9/1996 | Nagai |
| 5,573,976 A * | 11/1996 | Kato et al. ..................... 438/42 |
| 5,721,752 A * | 2/1998 | Takagi ...................... 372/49.01 |
| 5,960,019 A * | 9/1999 | Hayashi et al. ........... 372/46.01 |
| 6,323,052 B1 * | 11/2001 | Horie et al. .................... 438/46 |
| 6,358,316 B1 * | 3/2002 | Kizuki et al. ................ 117/105 |
| 6,614,821 B1 * | 9/2003 | Jikutani et al. ........... 372/43.01 |
| 6,668,001 B1 * | 12/2003 | Ohkubo .................... 372/45.01 |
| 6,670,202 B1 * | 12/2003 | Watanabe ..................... 438/20 |
| 6,677,618 B1 * | 1/2004 | Horie et al. .................... 257/94 |
| 6,697,406 B1 * | 2/2004 | Yamamura et al. ....... 372/46.01 |
| 6,744,074 B1 * | 6/2004 | Horie et al. .................... 257/88 |
| 6,882,671 B1 * | 4/2005 | Watanabe ................... 372/50.1 |
| 6,928,096 B1 * | 8/2005 | Nomura et al. .......... 372/46.01 |
| 2002/0020847 A1 * | 2/2002 | Horie et al. .................... 257/98 |
| 2002/0024985 A1 * | 2/2002 | Takeuchi et al. .............. 372/46 |
| 2002/0075923 A1 * | 6/2002 | Tashiro et al. ................. 372/45 |

(Continued)

FOREIGN PATENT DOCUMENTS

JP 7-162086 6/1995

(Continued)

*Primary Examiner*—Minsun Oh Harvey
*Assistant Examiner*—Phillip Nguyen
(74) *Attorney, Agent, or Firm*—Morrison & Foerster LLP

(57) ABSTRACT

The laser semiconductor device includes a semiconductor substrate, a first clad layer of a first conductivity type, an active layer, a second clad layer of a second conductivity type, and a protective layer of the second conductivity type, and peak wavelength of photo luminescence of an active layer (window region) in a region near an end surface of a laser resonator is smaller than peak wavelength of photo luminescence of the active layer (active region) in an inner region of the laser resonator. In the active layer in the region near the end surface of the laser resonator, first impurity atoms of a second conductivity and second impurity atoms of the second conductivity exist mixedly, with the concentration of the first impurity atoms being higher than that of the second impurity atoms.

8 Claims, 11 Drawing Sheets

U.S. PATENT DOCUMENTS

| | | |
|---|---|---|
| 2002/0126723 A1 | 9/2002 | Ohkubo |
| 2002/0159492 A1* | 10/2002 | Yamamura et al. ........... 372/46 |
| 2002/0163949 A1* | 11/2002 | Matsumoto et al. .......... 372/46 |
| 2003/0012241 A1* | 1/2003 | Onishi ......................... 372/46 |
| 2003/0021320 A1* | 1/2003 | Kan ............................. 372/46 |
| 2004/0165632 A1* | 8/2004 | Ohkubo et al. ............... 372/45 |
| 2004/0165633 A1* | 8/2004 | Tashiro et al. ................ 372/45 |

FOREIGN PATENT DOCUMENTS

| | | |
|---|---|---|
| JP | 11-284280 | 10/1999 |
| JP | 2001-094206 | 4/2001 |
| JP | 2001-251015 | 9/2001 |
| JP | 2002-204034 | 7/2002 |

* cited by examiner

SEMICONDUCTOR LASER DEVICE AND MANUFACTURING METHOD THEREOF

BACKGROUND OF THE INVENTION

1. Field of the Invention

The present invention relates to a semiconductor laser device used for optical disks and the like and to a method of manufacturing the same. More specifically, the present invention relates to a semiconductor laser device with a window structure having superior high-output operation characteristic, and to a method of manufacturing the same.

2. Description of the Background Art

Recently, various types of semiconductor lasers have come to be widely used as light sources for optical disks. Particularly, high-output semiconductor lasers are used as light sources for writing to disks for DVD (Digital Versatile Disc) players or DVD-RAM (Random Access Memory) drives, and still higher output is desired.

One factor that limits higher output of a semiconductor laser is COD (Catastrophic Optical Damage) generated in an active region near an end surface of a laser resonator, as optical output density increases.

A COD is generated as the active region near the end surface of the laser resonator comes to be an absorption region absorbing the laser beam. There are many non-radiative recombination centers on the end surface of the laser resonator as referred to as surface state or interface state, and carriers introduced to the active layer near the end surface of the laser resonator are lost because of the non-radiative recombination centers. Therefore, injection carrier concentration in the active layer near the end surface of the laser resonator is smaller than at a central portion. As a result, the active region near the end surface of the laser resonator comes to be an absorption region absorbing the laser beam of the wavelength resulting from the high carrier concentration at the central portion. Increase in optical output density results in local heat build up at the absorption region, causing higher temperature and smaller band gap energy. This yields a positive feedback that the absorption coefficient further increases and the temperature increases, and the temperature of the absorption region near the end surface of the laser resonator eventually reaches the melting point of the semiconductor material, generating the COD.

As one method of attaining higher output of a semiconductor laser, a method has been proposed in which an active layer of a multi-quantum well near the end surface of the laser resonator is disordered to provide a window structure, in order to improve characteristic level against the COD (Japanese Patent Laying-Open Nos. 7-162086, 11-284280).

FIGS. 18A to 18C are schematic illustrations representing the structure of the semiconductor laser device having the window structure. Specifically, FIG. 18C is a perspective view including the emission end surface, in which the reference character B represents window regions near the end surface of the laser resonator, and reference character A represents laser oscillation region (inner region) other than the window regions. FIG. 18A is a cross section of region A, and FIG. 18B is a cross section of region B.

As shown in FIGS. 18A to 18C, a conventional semiconductor laser device having a window structure includes, on an n type GaAs substrate 1001, an n type AlGaInP clad layer 1002, an MQW active layer (an active layer of multi-quantum well having a multi-quantum well structure with alternately stacked barrier and well layers sandwiched by optical guide layers) 1003, a p type AlGaInP clad layer 1004 and a p type GaAs first contact layer 1005 stacked in order. The p type AlGaInP clad layer 1004 and the p type GaAs first contact layer 1005 form a stripe shaped ridge 1008 to be a laser resonance wave guide path, and an n type GaAs current block layer 1009 is arranged to fill the side surfaces of the ridge. On ridge 1008 or n type GaAs current block layer 1009, a p type GaAs second contact layer 1010 and a p side electrode 1011 are arranged, and below the n type GaAs substrate 1001, an n side electrode 1012 is arranged.

At ridge 1008 in the region near the end surface of the laser resonator, a window structure region 1013 is formed, which is disordered by diffusion of Zn atoms from a ZnO film as a source of impurity diffusion.

FIGS. 19 to 22 represent steps of manufacturing a conventional semiconductor laser device having the window structure. First, as shown in FIG. 19, on n type GaAs substrate 1001, n type AlGaInP clad layer 1002, un-doped MQW (Multi-Quantum Well) active layer 1003, p type AlGaInP clad layer 1004 and p type GaAs first contact layer 1005 are formed successively. Here, p type AlGaInP clad layer 1004 is doped with Zn atoms as a p type impurity.

Next, as shown in FIG. 20, on the entire surface of the wafer, ZnO film 1006 as a source of impurity diffusion is formed. Thereafter, a stripe shaped resist mask 1021 is formed to extend in a direction horizontal to the end surface of the resonator of the semiconductor laser, and ZnO film 1006 that has been formed on the laser oscillation region other than the window region B is etched away.

Thereafter, resist mask 1021 is removed, and $SiO_2$ film 1007 is formed on the entire surface of the wafer. Then, a stripe shaped resist mask (not shown) is formed to extend in a direction vertical to the end surface of the resonator of the semiconductor laser, and $SiO_2$ film 1007 formed on the current block region etched. Then, the resist mask (not shown) is removed, and portions of p type GaAs first contact layer 1005 and p type AlGaInP clad layer 1004 are etched to form ridge 1008.

Thereafter, as shown in FIG. 22, n type GaAs current block layer 1009 is grown for filling, $SiO_2$ film 1007 is removed, GaAs second contact layer 1010 is grown, and heat treatment is performed for about 30 minutes at a temperature of 500° C. or higher, which is the temperature at the time of growing the current block layer, so that Zn atoms are thermally diffused from ZnO film 1006 as a source of impurity diffusion into p type GaAs first contact layer 1005, p type AlGaInP clad layer 1004 and MQW active layer 1003. Consequently, MQW active layer 1003 is disordered, resulting in a window structure region 1013. Thereafter, p type electrode 1011 and n type electrode 1012 are formed, the wafer is cleaved, and the semiconductor device shown in FIG. 18A to 18C is obtained.

As described above, in the conventional semiconductor laser device having a window structure, in the window region B formed near the end surface of the laser resonator, ZnO film 1006 is formed such that the band gap energy becomes larger than that corresponding to the laser oscillation wavelength, and Zn atoms are thermally diffused into MQW active layer 1003.

Further, in order to promote diffusion of Zn atoms to the window region B and to suppress diffusion of Zn atoms to the active region in inner region A, a proposal has been made to provide a layer containing Si atoms, on the film 1006 as a source of impurity diffusion (Japanese Patent Laying-Open No. 2001-94206).

Here, in order to have the band gap energy of the active region near the light emission end surface larger than the band gap energy corresponding to laser oscillation wavelength, annealing at a high temperature over a long period of time is necessary. According to the conventional method described above, the impurity atoms diffused from ZnO film 1006 as a source of impurity diffusion and the impurity atoms doped in p type AlGaInP clad layer 1004 are both Zn atoms that have large diffusion coefficient in AlGaInP based material. Accordingly, Zn atoms diffuse into MQW active layer 1003 even in the inner region, resulting in increase of driving current or driving voltage at a high-output operation and in lower reliability over a long period of time. Even when the method proposed in Japanese Patent Laying-Open No. 2001-94206 is used, diffusion of Zn atoms into the active region in the inner region A cannot sufficiently be suppressed from the reason described above.

Diffusion of Zn atoms into the MQW active region in the inner region can be suppressed by lowering the annealing temperature or shortening annealing time. This, however, results in insufficient diffusion of Zn atoms into the MQW active layer 1003 in the window region B. This leads to absorption of much more laser beam at the active layer near the end surface of the laser resonator, making generation of COD more likely. Further, maximum optical output at the time of high-output driving would be lower and satisfactory long-life reliability would not be attained.

SUMMARY OF THE INVENTION

An object of the present invention is to provide a semiconductor laser device and manufacturing method thereof, which can reduce driving current at a high-output operation and ensure high reliability over a long period of time.

According to an aspect, the present invention provides a semiconductor laser device, including: a semiconductor substrate; a first clad layer of a first conductivity type; an active layer; a second clad layer of a second conductivity type; and a protective layer of the second conductivity type; wherein peak wavelength of photo luminescence in the active layer in a region near an end surface of a laser resonator is smaller than peak wavelength of photo luminescence of the active layer in an inner region of the laser resonator; and first impurity atoms of a second conductivity and second impurity atoms of the second conductivity exist mixedly in the active layer in the region near the end surface of the laser resonator, with concentration of the first impurity atoms being higher than that of the second impurity atoms. Preferably, in the semiconductor laser device in accordance with the present invention, in the second clad layer in the region near the end surface of the laser resonator and in the protective layer also, first impurity atoms of the second conductivity and second impurity atoms of the second conductivity exist with the concentration of the first impurity atoms being higher than that of the second impurity atoms.

According to an aspect, the present invention provides a method of manufacturing a semiconductor laser device, including the steps of: growing, on a semiconductor substrate, a stacked structure including a first clad layer of a first conductivity type containing Si atoms, an active layer, a second clad layer of a second conductivity type containing first impurity atoms having a second conductivity, a conduction facilitating layer of the second conductivity type and a protective layer of the second conductivity type; forming a film as a source of impurity diffusion containing second impurity atoms having the second conductivity, in a region near an end surface of a laser resonator of a wafer having the stacked structure grown thereon; forming a dielectric film containing Si atoms and thicker than the film as a source of impurity diffusion on a surface of the wafer; and annealing the wafer to diffuse the first impurity atoms contained in the second clad layer in the region near the end surface of the laser resonator and the second impurity atoms contained in the film as a source of impurity diffusion in the region near the end surface of the laser resonator into the active layer, to make peak wavelength of photo luminescence of the active layer in the region near the end surface of the laser resonator smaller than peak wavelength of photo luminescence of the active layer in an inner region of the laser resonator.

According to another aspect, the present invention provides a method of manufacturing a semiconductor laser device, including the steps of: growing, on a semiconductor substrate, a stacked structure including a first clad layer of a first conductivity type containing Si atoms, an active layer, a second clad layer of a second conductivity type containing first impurity atoms having a second conductivity, a conduction facilitating layer of the second conductivity type and a protective layer of the second conductivity type; forming a film as a source of impurity diffusion containing second impurity atoms having the second conductivity and Si atoms, in a region near an end surface of a laser resonator of a wafer having the stacked structure grown thereon; and annealing the wafer to diffuse the first impurity atoms contained in the second clad layer in the region near the end surface of the laser resonator and the second impurity atoms contained in the film as a source of impurity diffusion in the region near the end surface of the laser resonator into the active layer, to make peak wavelength of photo luminescence of the active layer in the region near the end surface of the laser resonator smaller than peak wavelength of photo luminescence of the active layer in an inner region of the laser resonator.

According to the present invention, diffusion of the first impurity atoms and the second impurity atoms into the window region of the semiconductor laser device is promoted, and hence, annealing temperature can be lowered at the time when the window region is disordered. Further, according to the present invention, diffusion of the second impurity atoms into the active region is suppressed, and therefore, disordering and degradation of crystal characteristics in the active region can be suppressed. Thus, shortening of the oscillation wavelength is prevented, driving current at a high-output operation can be reduced, generation of CODs can be avoided even at the time of high-output drive, and a semiconductor laser device highly reliable over a long period of time can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
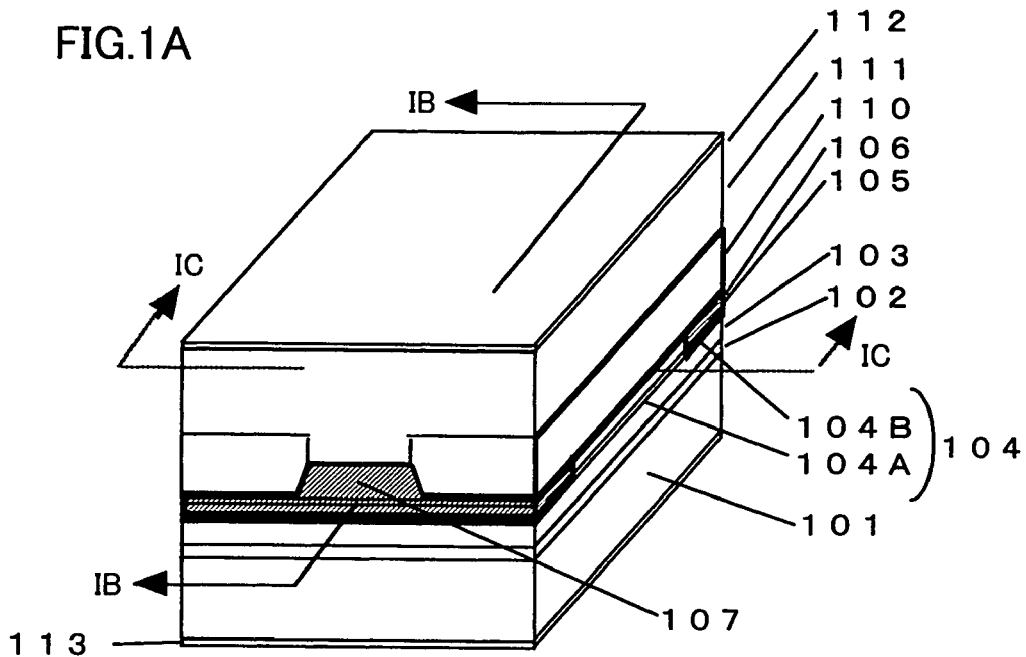
FIGS. 1A to 1C are schematic views representing a structure of a semiconductor laser device in accordance with a first embodiment of the present invention.

According to an aspect, the present invention provides a semiconductor laser device, including: a semiconductor substrate; a first clad layer of a first conductivity type; an active layer; a second clad layer of a second conductivity type; and a protective layer of the second conductivity type; wherein peak wavelength of photo luminescence in the active layer in a region near an end surface of a laser resonator is smaller than peak wavelength of photo luminescence of the active layer in an inner region of the laser resonator; and first impurity atoms of a second conductivity and second impurity atoms of the second conductivity exist mixedly in the active layer in the region near the end surface of the laser resonator, with concentration of the first impurity atoms being higher than that of the second impurity atoms.

Here, the first conductivity type or the second conductivity type refers to a conductivity type of each layer constituting the laser semiconductor device. By way of example, when the first conductivity type is n type, the second conductivity type is p type, and when the first conductivity type is p type, the second conductivity type is n type. The first conductivity or the second conductivity refers to conductivity of impurity atoms diffused into each layer constituting the semiconductor laser device. By way of example, when the first conductivity is n type, the second conductivity is p type, and when the first conductivity is p type, the second conductivity is n type. The first conductivity type and the first conductivity, and the second conductivity type and the second conductivity refer to the same type, respectively. When the first conductivity type and the first conductivity are n type, the second conductivity type and the second conductivity are p type.

The first impurity atoms refer to atoms of an impurity that has small diffusion coefficient in a material of the clad layer and of the MQW active layer, particularly in an AlGaInP based material, such as represented by Be atoms. The second impurity atoms refer to atoms of an impurity that has a large diffusion coefficient in the material of the clad layer and of the MQW active layer, particularly in the AlGaInP based material, such as represented by Zn atoms and Mg atoms. Zn atoms are more preferred, as the diffusion coefficient is larger than that of Mg atoms and diffusion amount thereof can more easily be controlled.

As the active region is disordered by the atoms of the first and second impurities, annealing temperature can be made lower in the step of disordering the active layer, diffusion of the first impurity atoms existing in the second clad layer in the inner region of the semiconductor resonator into the active layer can be suppressed, and the driving current at a high-output operation can be reduced. Further, as the first impurity atoms exist at a higher concentration than the second impurity atoms, variation in wavelength shift of the window region at the wafer surface can be suppressed.

Preferably, in the semiconductor laser device in accordance with the present invention, in the second clad layer in the region near the end surface of the laser resonator and in the protective layer also, first impurity atoms of the second conductivity and second impurity atoms of the second conductivity exist with the concentration of the first impurity atoms being higher than that of the second impurity atoms. The second impurity atoms have diffusion coefficient larger than that of the first impurity atoms, and hence, it becomes possible to suppress diffusion of the second impurity atoms into the inner region of the semiconductor resonator, and hence to prevent disordering of the active layer and degradation of crystal characteristics in the inner region of the semiconductor resonator. Thus, shortening of the oscillation wavelength can be suppressed, and long life reliability at high-output drive can be improved.

Preferably, in the semiconductor laser device in accordance with the present invention, concentration of the second impurity atoms in the active layer (window region) in the region near the end surface of the laser resonator is at least $1 \times 10^{16}$ atoms/cm$^3$ and at most $1 \times 10^{18}$ atoms/cm$^3$. When the concentration of the second impurity atoms is lower than $1 \times 10^{16}$ atoms/cm$^3$, diffusion of the first and second impurity atoms to the active layer in the inner region of the laser resonator can be suppressed, whereas amount of wavelength shift varies considerably in the window region at the wafer surface, lowering reproductivity among different lots. When the concentration of the second impurity atoms exceeds $1 \times 10^{18}$ atoms/cm$^3$, it becomes possible to control amount of wavelength shift in the window region, whereas the first and second impurity atoms diffuse into the active layer in the inner region, resulting in increased driving current.

Preferably, in the semiconductor laser device in accordance with the present invention, the first impurity atoms are the same as the impurity atoms contained in the second clad layer near the active layer. In such a structure, the first impurity atoms that make the active layer disordered exist in the second clad layer near the active layer in the region near the end surface of the laser resonator, and therefore, annealing temperature can be lowered or annealing time can be reduced, driving current at a high-output operation can be reduced, long life reliability at high-output drive can be improved and generation of CODs can be prevented.

Further, in the semiconductor laser device in accordance with the present invention, preferably, the first clad layer contains Si atoms. In this structure, diffusion of the atoms of the first and second impurities of the second conductivity into the first clad layer having the first conductivity type can be suppressed. Accordingly, driving current at the time of a high-output operation can be reduced.

Preferably, in the semiconductor device in accordance with the present invention, the semiconductor substrate contains GaAs, and a semiconductor layer stacked on the semiconductor substrate contains an AlGaInP based material. By the use of these materials, a semiconductor laser device having a desired oscillation wavelength can be obtained.

In the semiconductor laser device in accordance with the present invention, preferably, the first impurity atoms are Be atoms. The Be atoms have small diffusion coefficient in an AlGaInP based material, and therefore, in the structure described above, even when annealing is performed at the time of forming the window region, diffusion into the active layer in the inner region of the laser resonator can be suppressed. Accordingly, driving current at the time of high-output operation can be reduced, long life reliability can be improved and generation of CODs can be prevented.

Preferably, in the semiconductor laser device in accordance with the present invention, the second impurity atoms are Zn atoms or Mg atoms. Zn atoms are more preferable, as diffusion coefficient of Zn atoms is larger than that of Mg and diffusion amount thereof can more easily be controlled. The Zn atoms and Mg atoms have diffusion coefficients larger than that of Be atoms in the AlGaInP based material. Therefore, in the above described structure, it becomes possible to lower the annealing temperature when the window region is formed, and diffusion into the active layer in the inner region of the laser resonator can be suppressed. Accordingly, driving current at the time of high-output operation can be reduced, long life reliability can be improved and generation of CODs can be prevented.

According to an aspect, the present invention provides a method of manufacturing a semiconductor laser device, including the steps of: growing, on a semiconductor substrate, a stacked structure including a first clad layer of a first conductivity type containing Si atoms, an active layer, a second clad layer of a second conductivity type containing first impurity atoms having a second conductivity, a conduction facilitating layer of the second conductivity type and a protective layer of the second conductivity type; forming a film as a source of impurity diffusion containing second impurity atoms having the second conductivity, in a region near an end surface of a laser resonator of a wafer having the stacked structure grown thereon; forming a dielectric film containing Si atoms and thicker than the film as a source of impurity diffusion on a surface of the wafer; and annealing the wafer to diffuse the first impurity atoms contained in the second clad layer in the region near the end surface of the laser resonator and the second impurity atoms contained in the film as a source of impurity diffusion in the region near the end surface of the laser resonator into the active layer, to make peak wavelength of photo luminescence of the active layer in the region near the end surface of the laser resonator smaller than peak wavelength of photo luminescence of the active layer in an inner region of the laser resonator.

By such a structure of the present invention, the second impurity atoms included in the film as the source of impurity diffusion can be diffused with acceleration, and therefore, annealing temperature can be made lower. Further, as the annealing temperature is made lower, diffusion of the first impurity atoms of the second conductivity into the active layer in the inner region of the laser resonator can be suppressed.

Preferably, in the method of manufacturing the semiconductor laser device, the film as a source of impurity diffusion contains $Zn_xO_y$ (x and y are numbers not smaller than 1). When a $Zn_xO_y$ (x and y are numbers not smaller than 1) film that is powder-like and near amorphous is used, generation of stress caused by the difference in thermal expansion coefficient between each of the epitaxially grown layers can be suppressed at the time of annealing for forming the window region. Further, diffusion of the first impurity atoms as well as the diffusion of the second impurity atoms are promoted and the active layer (window region) in the region near the end surface of the laser resonator is disordered.

Preferably, in the method of manufacturing the semiconductor laser device described above, the dielectric film contains any of $Si_xO_y$, $Si_xN_y$, and $Si_xO_yN_z$ (x, y and z are numbers not smaller than 1). As Si atoms that suppress diffusion of Zn atoms are contained in the dielectric film, it becomes possible in this structure to efficiently diffuse the Zn atoms to the active layer (window region) in the region near the end surface of the laser resonator.

Further, in the method of manufacturing the semiconductor laser device described above, preferably, the thickness of the film as the source of impurity diffusion is at least 5 nm and at most 50 nm. When the film thickness is thinner than 5 nm, the number of impurity atoms in the film as the source of impurity diffusion becomes small, and when the film thickness exceeds 50 nm, the powder-like, near amorphous nature of the film is lost, and in either case, the function of the film as a source of impurity diffusion degrades.

According to another aspect, the present invention provides a method of manufacturing a semiconductor laser device, including the steps of: growing, on a semiconductor substrate, a stacked structure including a first clad layer of a first conductivity type containing Si atoms, an active layer, a second clad layer of a second conductivity type containing first impurity atoms having a second conductivity, a conduction facilitating layer of the second conductivity type and a protective layer of the second conductivity type; forming a film as a source of impurity diffusion containing second impurity atoms having the second conductivity and Si atoms, in a region near an end surface of a laser resonator of a wafer having the stacked structure grown thereon; and annealing the wafer to diffuse the first impurity atoms contained in the second clad layer in the region near the end surface of the laser resonator and the second impurity atoms contained in the film as a source of impurity diffusion in the region near the end surface of the laser resonator into the active layer, to make peak wavelength of photo luminescence of the active layer in the region near the end surface of the laser resonator smaller than peak wavelength of photo luminescence of the active layer in an inner region of the laser resonator. This simplifies the manufacturing steps, diffusion of the first and second impurity atoms into the active layer (window region) in the region near the end surface of the laser resonator is promoted, and diffusion of the first impurity atoms into the active layer in the inner region of the laser resonator can be suppressed.

Further, in the method of manufacturing the semiconductor laser device described above, preferably, the film as a source of impurity diffusion containing the second impurity atoms and Si atoms includes $Zn_xSi_yO_z$ (x, y and z are numbers not smaller than 1). By the use of such a film, external diffusion of the Zn atoms at the time of annealing can be suppressed, and diffusion of Zn atoms into the active layer (window region) in the region near the end surface of the laser resonator can be promoted.

First Embodiment

Figure 1B:
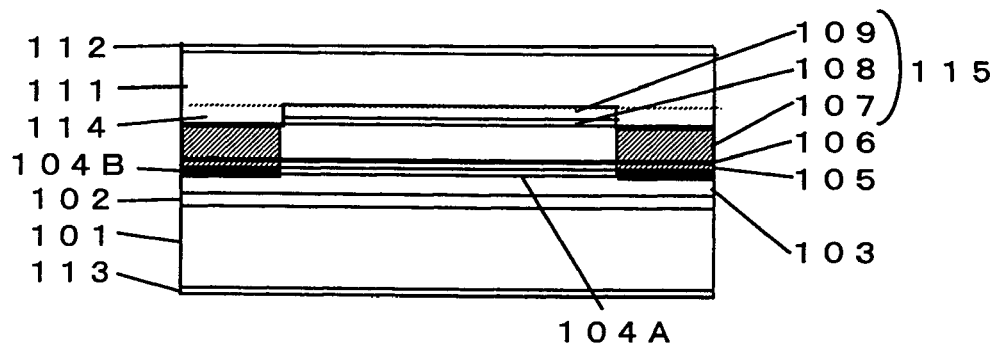
Figure 1C:
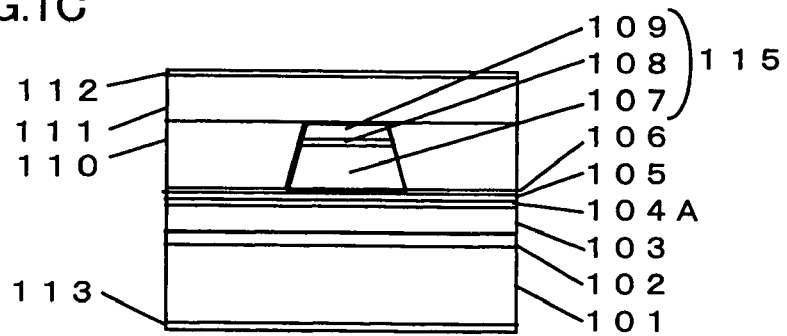

Embodiments of the present invention will be described in detail in the following with reference to the figures. FIGS. 1A to 1C are schematic illustrations representing the structure of the semiconductor laser device in accordance with one embodiment of the present invention. Here, FIG. 1A is a perspective view including the light emitting end surface, FIG. 1B is a cross section taken along the line IB—IB of FIG. 1A, and FIG. 1C is a cross section taken along the line IC—IC of FIG. 1A.

As shown in FIGS. 1A to 1C, in the semiconductor laser device in accordance with the present embodiment, on an n type GaAs substrate 101, an n type $Ga_yIn_zP$ (y and z are numbers of 0 to 1 satisfying the relation of y+z=1, same in the following) buffer layer 102, an n type $Al_xGa_yIn_zP$ (x, y and z are numbers of 0 to 1 satisfying the relation of x+y+z=1, same in the following) first clad layer 103, an MQW active layer (an active layer of multi-quantum well having a multi-quantum well structure with alternately stacked barrier and well layers sandwiched by optical guide layers) 104, a p type $Al_xGa_yIn_zP$ second clad layer 105 and a p type etching stop layer 106 stacked successively. On the p type etching stop layer 106, a p type $Al_xGa_yIn_zP$ third clad layer 107, a p type $Ga_yIn_zP$ intermediate layer 108 and a p type GaAs protective layer 109 are arranged in a ridge stripe shape along the resonator direction. An n type $Al_xIn_zP$ (x and z are numbers of 0 to 1 satisfying the relation of x+z=1, same in the following) current block (extruding) layer 110 is arranged to fill the sides of the p type $Al_xGa_yIn_zP$ third clad layer 107. On the p type GaAs protective layer 109 or n type $Al_xIn_zP$ current block layer 110, a p type GaAs contact layer 111 and a p type GaAs side electrode 112 are arranged, and below the n type GaAs substrate 101, an n side electrode 113 is arranged.

Here, in the MQW active layer 104, the peak wavelength of photo luminescence of the window region (MQW active layer in the region near the end surface of the laser resonator) 104B is designed to be smaller than the peak wavelength of photo luminescence of the active region (MQW active layer in the inner region of the laser resonator) 104A. Further, on the p type GaAs protective layer 109 above the window region, a current non-injection region 114 is provided. By the p type $Al_xGa_yIn_zP$ third clad layer 107, p type $Ga_yIn_zP$ intermediate layer 108 and p type GaAs protective layer 109, a stripe shaped ridge 115 to be a laser resonance wave guide path is formed.

Figure 2:
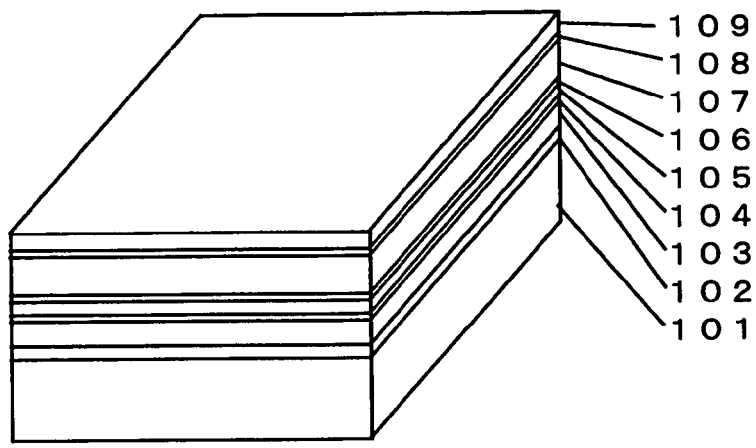
FIGS. 2 to 7 successively show process steps of manufacturing the semiconductor laser device in accordance with the first embodiment of the present invention.

FIGS. 2 to 7 show process steps of manufacturing the semiconductor laser device in accordance with the first embodiment of the present invention. First, as shown in FIG. 2, on n type GaAs substrate 101 (carrier concentration: $2 \times 10^{18}$ atoms/cm$^3$), n type $Ga_yIn_zP$ buffer layer 102 (carrier concentration: $1 \times 10^{18}$ atoms/cm$^3$), n type $Al_xGa_yIn_zP$ first clad layer 103 (carrier concentration: $1 \times 10^{18}$ atoms/cm$^3$), MQW active layer 104, p type $Al_xGa_yIn_zP$ second clad layer 105 (carrier concentration: $2 \times 10^{18}$ atoms/cm$^3$), p type etching stop layer 106 (carrier concentration: $2 \times 10^{18}$ atoms/cm$^3$), p type $Al_xGa_yIn_zP$ third clad layer 107 (carrier concentration: $2 \times 10^{18}$ atoms/cm$^3$), p type $Ga_yIn_zP$ intermediate layer 108 (carrier concentration: $5 \times 10^{18}$ atoms/cm$^3$), and p type GaAs protective layer 109 (carrier concentration: $1 \times 10^{19}$ atoms/cm$^3$) are grown successively by molecular beam epitaxy (MBE) method. Here, in each of n type GaAs substrate 101, n type $Ga_yIn_zP$ buffer layer 102 and n type $Al_xGa_yIn_zP$ first clad layer 103, Si atoms are contained as carrier atoms, while in each of p type $Al_xGa_yIn_zP$ second clad layer 105, p type etching stop layer 106, p type $Al_xGa_yIn_zP$ third clad layer 107, p type $Ga_yIn_zP$ intermediate layer 108 and p type GaAs protective layer 109, Be atoms of p type conductivity are contained as carrier atoms.

Figure 3:
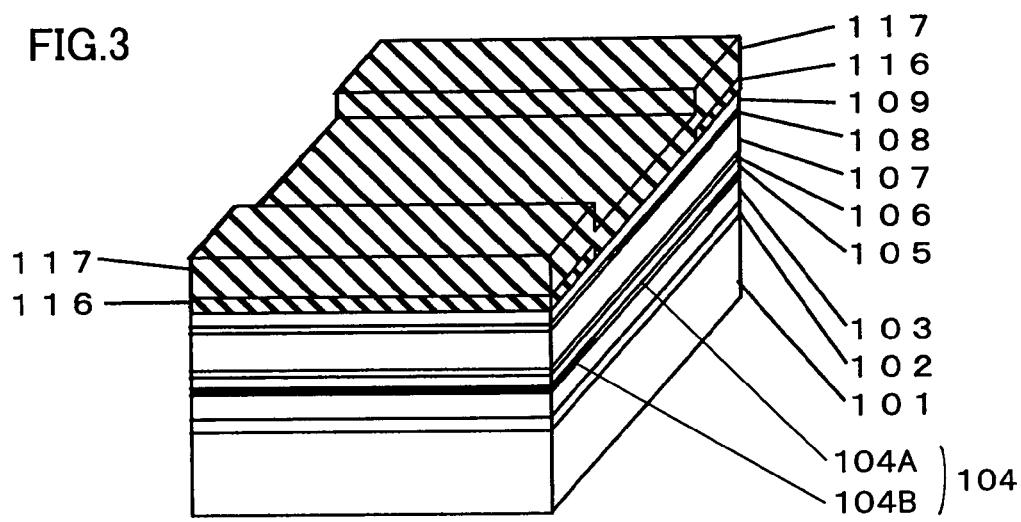

Thereafter, as shown in FIG. 3, on the surface of p type GaAs protective layer 109 in the region near the end surface of the laser resonator, an $Zn_xO_y$ (x and y are numbers not smaller than 1, same in the following) film 116 as a source of impurity diffusion in a stripe shape having the width of 60 μm and the thickness of 35 nm is formed in a direction orthogonally crossing the ridge stripe, using common photolithography technique. Thereafter, an $Si_xO_y$ (x and y are numbers not smaller than 1, same in the following) film 117 that is a dielectric film containing Si atoms is formed to the thickness of 200 nm, on the entire surface of the wafer. The pitch of the stripes of $Zn_xO_y$ film 116 is set to 800 μm, that is the same as the resonator length.

Then, the wafer having the $Zn_xO_y$ film 116 formed thereon is annealed in a nitrogen atmosphere at a temperature of 510° C. for a holding time of 2 hours, so as to diffuse the Zn atoms contained in the $Zn_xO_y$ film 116 to the window region 104B and to diffuse Be atoms contained in each of p type $Al_xGa_yIn_zP$ second clad layer 105, p type etching stop layer 106, p type $Al_xGa_yIn_zP$ third clad layer 107, p type $Ga_yIn_zP$ intermediate layer 108 and p type GaAs protective layer 109 to MQW active layer 104 entirely, whereby the peak wavelength of photo luminescence of window region 104B is made smaller than the peak wavelength of photo luminescence of active region 104A.

Figure 4:
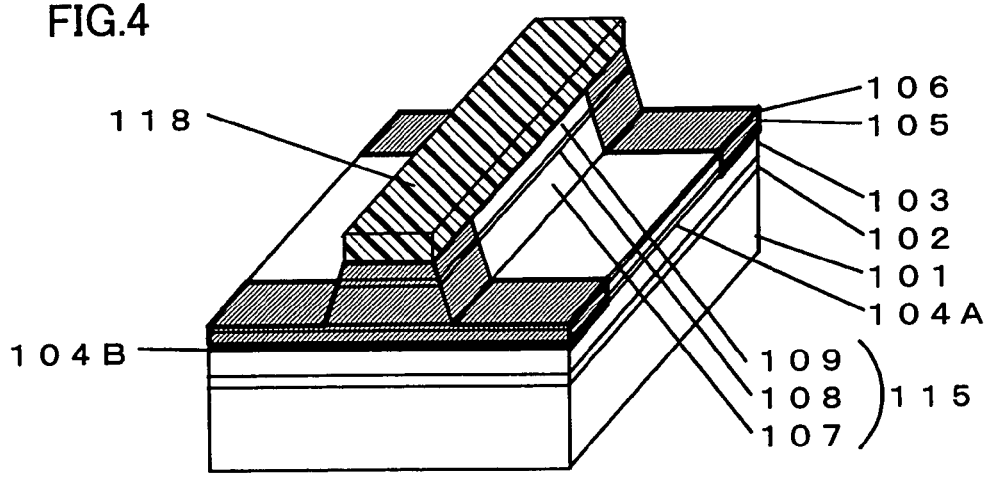

Thereafter, referring to FIG. 4, $Zn_xO_y$ film 116 and $Si_xO_y$ film 117 formed on p type GaAs protective layer 109 are removed, and using known photolithography technique, a stripe shaped resist mask 118 extending in a direction vertical to the end surface of the laser resonator is formed on p type GaAs protective layer 109, and using known etching technique, p type GaAs protective layer 109, p type $Ga_yIn_zP$ intermediate layer 108 and p type $Al_xGa_yIn_zP$ third clad layer 107 are processed to a stripe shaped ridge 115 having the width of about 3 μm, to reach the p type etching stop layer 106.

Figure 5:
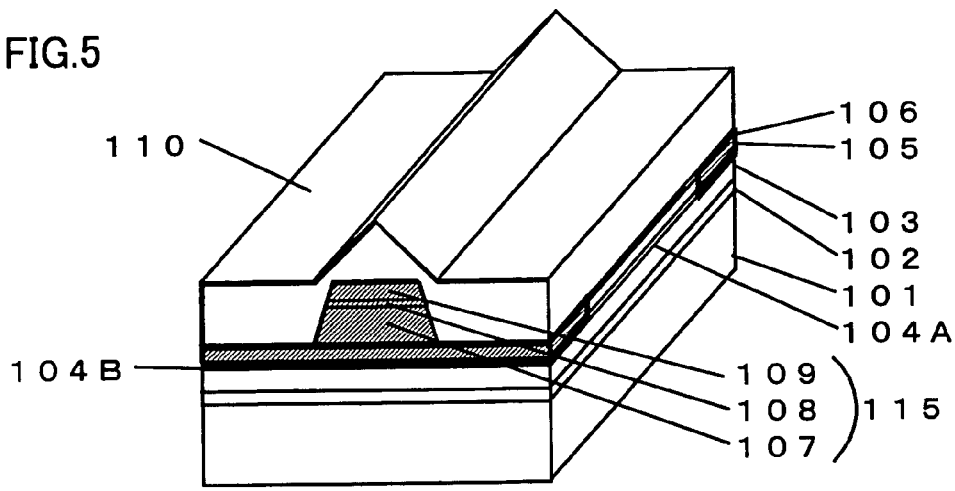
Figure 6:
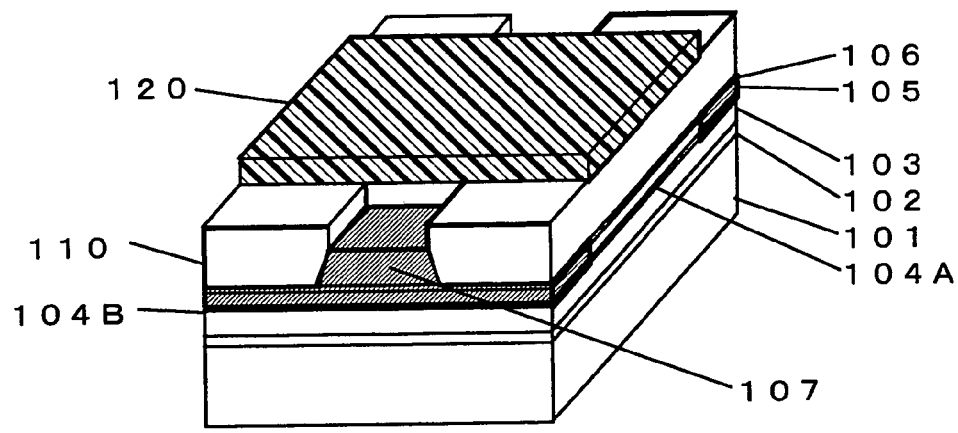

Then, stripe shaped resist mask 118 formed on p type GaAs protective layer 109 is removed, and as shown in FIG. 5, by the second MBE method, side surfaces of ridge 115 are filled by n type $Al_xIn_zP$ current block layer 110.

Thereafter, using known photolithography technique, on the surface of n type $Al_xIn_zP$ current block layer 110 formed on the sides of ridge 115, a resist mask (not shown) is formed, and using known etching technique, n type $Al_xIn_zP$ current block layer 110 formed on ridge 115 at the opening of the resist mask (not shown) is selectively removed.

Thereafter, the resist mask (not shown) formed on n type $Al_xIn_zP$ current block layer 110 is removed. Thereafter, as shown in FIG. 6, again using known photo resist lithography technique, a resist mask 120 having the width of 740 μm is formed in the inner region of the laser resonator, and p type GaAs protective layer 109 and p type $Ga_yIn_zP$ intermediate layer 108 at the opening of resist mask 120 are selectively removed. The opening of resist mask 120 is formed to be positioned directly above the window region 104B.

Figure 7:
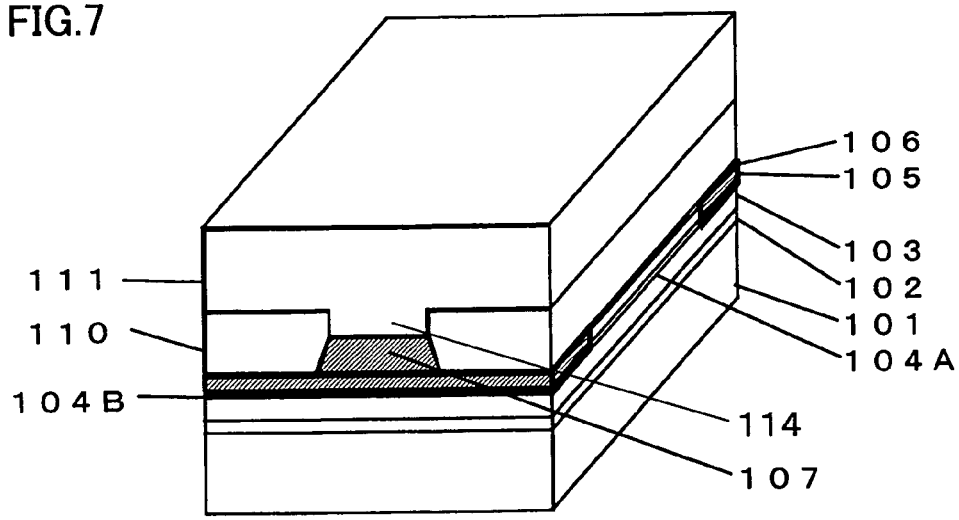

Thereafter, as shown in FIG. 7, resist mask 120 formed in the inner region of the laser resonator is removed, and by a third MBE method, p type GaAs contact layer 111 is formed. At this time, at portions of p type GaAs protective layer 109 and p type $Ga_yIn_zP$ intermediate layer 108 that have been selectively removed in the step shown in FIG. 6, because of a difference in band gap energy between p type $Al_xGa_yIn_zP$ third clad layer 107 in the region near the end surface of the laser resonator and p type GaAs protective layer 109 in the inner region of the laser resonator, a current non-injection region 114 is formed. The current non-injection region 114 is positioned directly above the window region 104B, and therefore, it prevents injection of current to the window region 104B and reduces ineffective current that does not contribute to light emission.

Next, approximately at the center of the region near the end surface of the laser resonator having the width of 60 μm, a scribe line is formed and the body is divided to a bar having the length of the resonator. Finally, light emitting surfaces on both sides of the bar are coated with a reflective film, and the bar is divided into chips. Thus, a semiconductor laser device is completed, which has a window region and a current non-injection region of about 30 µm at an end surface portion of the laser resonator, the resonator having the length of 800 µm.

Figure 8:
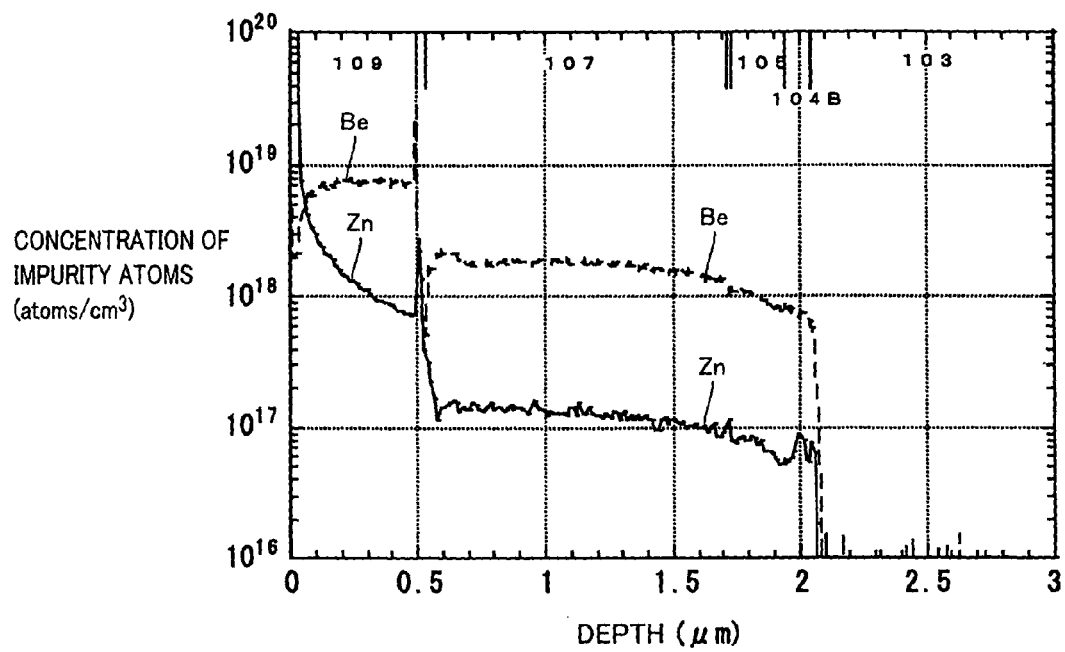
FIG. 8 represents concentration distribution in the depth direction of Be atoms and Zn atoms in a region near the end surface of a laser resonator in the ridge of the semiconductor laser device in accordance with the first embodiment of the present invention.
Figure 9:
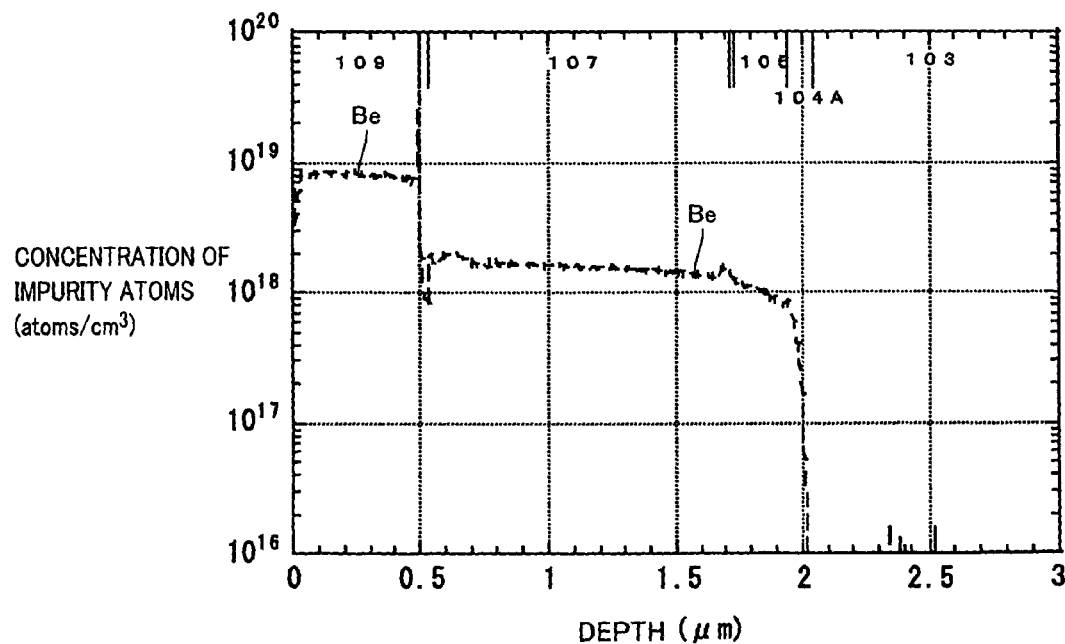
FIG. 9 represents concentration distribution in the depth direction of Be atoms and Zn atoms in an inner region of a laser resonator in the ridge of the semiconductor laser device in accordance with the first embodiment of the present invention.

FIG. 8 represents concentration distribution in the depth direction of Be atoms and Zn atoms in a region near the end surface, and FIG. 9 represents concentration distribution in the depth direction of Be atoms and Zn atoms in an inner region, of a laser resonator in the ridge of the semiconductor laser device in accordance with the present embodiment obtained after the end of the step shown in FIG. 3 and annealing. The distribution of Be and Zn atoms in the depth direction was measured by secondary ion-mass spectrography (SIMS). In FIGS. 8 and 9, the abscissa represents the depth (µm) from the p type GaAs protective layer 109, the ordinate represents concentration of impurity atoms (atoms/cm$^3$), the dotted line represents the concentration distribution of Be atoms and the solid line represents the concentration distribution of Zn atoms, in the depth direction.

As shown in FIG. 8, in window region 104B, Be atoms diffused from each of p type $Al_xGa_yIn_zP$ second clad layer 105, p type etching stop layer 106, p type $Al_xGa_yIn_zP$ third clad layer 107, p type $Ga_yIn_zP$ intermediate layer 108 and p type GaAs protective layer 109 and Zn atoms diffused from $Zn_xO_y$ film 116 as a source of impurity diffusion exist mixed with each other, and the concentration of Zn atoms was $8\times10^{16}$ atoms/cm$^3$. Further, it has been observed that in each of the layers from window region 104B to p type GaAs protective layer 109, Be atoms exist at a higher concentration than Zn atoms.

Specifically, it has been confirmed that by the manufacturing method described above, the concentration of the first impurity atoms having the second conductivity (Be atoms) can be made higher than the concentration of the second impurity atoms having the second conductivity (Zn atoms), in the window region 104B, the second clad layer of the second conductivity type (p type $Al_xGa_yIn_zP$ second clad layer 105) in the region near the end surface of the laser resonator and in the protective layer of the second conductivity type (p type GaAs protective layer 109).

Further, referring to FIG. 9, in each of the layers from active region 104A to p type GaAs protective layer 109, entrance of Zn atoms was not observed. From this result, it has been confirmed that by the above described manufacturing method including the steps of forming an impurity diffusion film ($Zn_xO_y$ film 116) including the second impurity atoms of the second conductivity (Zn atoms) in the region of the end surface of the laser resonator and the step of forming a dielectric film containing Si atoms ($Si_xO_y$ film 117) thicker than the impurity diffusion film ($Zn_xO_y$ film 116), diffusion of the first impurity atoms having the second conductivity (Be atoms) into the MQW active layer (active region 104A) of the inner region of the laser resonator can be suppressed, and diffusion of the second impurity atoms of the second conductivity (Zn atoms) into the inner region of the laser resonator (active region 104A, p type $Al_xGa_yIn_zP$ second clad layer 105, p type $Al_xGa_yIn_zP$ third clad layer 107 and p type GaAs protective layer 109) can be suppressed.

Using photo luminescence (PL) method, wavelength of the window region 104B and active region 104A was measured, of a part of a wafer obtained after the end of the step shown in FIG. 3 and annealing, in accordance with the method of manufacturing the semiconductor laser device in accordance with the present embodiment.

For comparison, using a first comparative wafer (Comparative Example 1), in which the thickness of $Si_xO_y$ film 117 as a dielectric film containing Si atoms was changed to 20 nm to be thinner than $Zn_xO_y$ film 116 as a source of impurity diffusion (having the thickness of 35 nm), and a second comparative wafer (Comparative Example 2) in which $Si_xO_y$ film 117 as a dielectric film containing Si atoms was replaced by an $Al_xO_y$ film (x and y are numbers not smaller than 1, same in the following) as a dielectric film not containing Si, with other aspects in accordance with the method of manufacturing the semiconductor laser device of the present embodiment, the wavelength of the window region 104B and active region 104A was measured, similarly by the PL method.

As a result, it was found that the emission spectrum from the window region 104B in accordance with the present embodiment was shifted from the emission spectrum from the active region 104A by 38 nm to the shorter wavelength side. Further, it was found that the emission spectrum from the window region of Comparative Example 1 was shifted from the emission spectrum from the active region by 5 nm to the shorter wavelength side, and the emission spectrum from the window region of Comparative Example 2 was shifted from the emission spectrum from the active region by 10 nm to the shorter wavelength side.

From the foregoing, it has been confirmed that, under the same annealing condition, when the above described manufacturing method is used that includes the step of forming a film as a source of impurity diffusion ($Zn_xO_y$ film 116) containing the second impurity atoms (Zn atoms) of the second conductivity in a region near the end surface of the laser resonator and the step of forming a dielectric film ($Si_xO_y$ film 117) containing Si atoms and thicker than the film as a source of impurity diffusion ($Zn_xO_y$ film 116), it becomes possible to diffuse the second impurity atoms (Zn atoms) included in the film as a source of impurity diffusion ($Zn_xO_y$ film 116) in an accelerated manner, and hence it becomes possible to make the peak wavelength of photo luminescence of the MQW active layer (window region 104B) in the region near the end surface of the laser resonator sufficiently smaller than the peak wavelength of photo luminescence of the MQW active layer (active region 104A) in the inner region of the laser resonator. Particularly because the step of forming a dielectric film ($Si_xO_y$ film 117) containing Si atoms on the film as a source of impurity diffusion ($Zn_xO_y$ film 116) is included, external diffusion of Zn atoms at the time of annealing can be suppressed, and the Zn atoms can efficiently be diffused to the window region 104B.

Use of $Zn_xO_y$ film 116 as the source of impurity diffusion promotes diffusion of the second impurity atoms (Zn atoms) as well as diffusion of the first impurity atoms (Be atoms) to the window region 104B and hence promotes disordering of the window region. Thus, the use of this film is preferable also from the viewpoint of making the peak wavelength of photo luminescence of window region 104B sufficiently smaller than the peak wavelength of photo luminescence of active region 104A.

Figure 10:
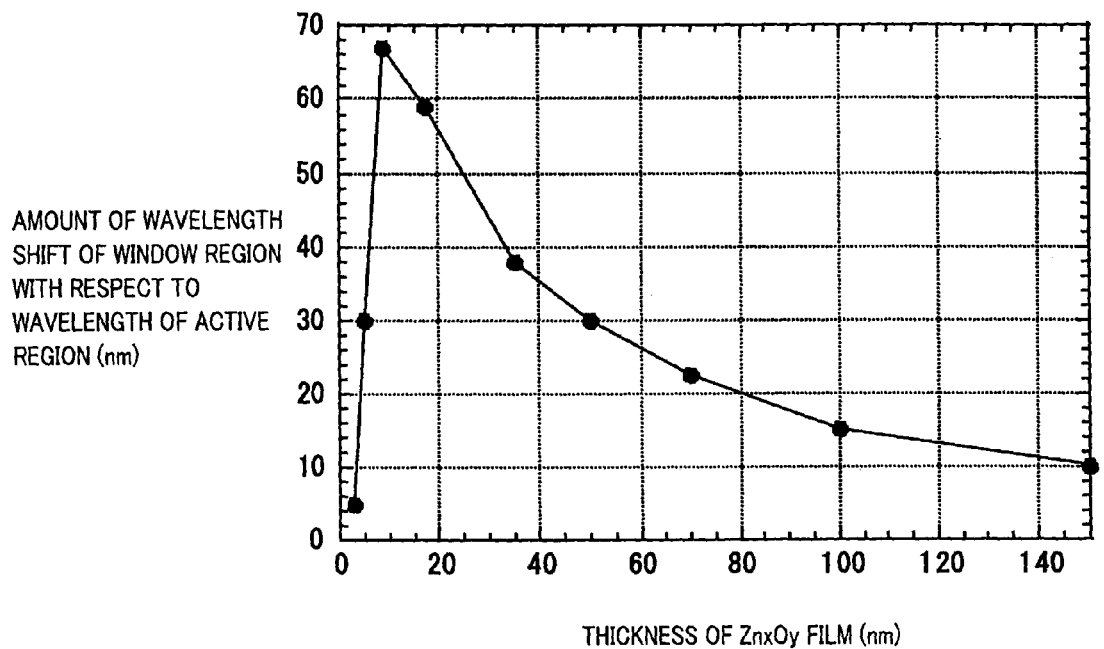
FIG. 10 represents relation between thickness of $Zn_xO_y$ film 116 as a source of impurity diffusion formed in a region near an end surface of the laser resonator and the amount of shifting of the peak wavelength in the window region to the side of lower wavelength with respect to the peak wavelength in the active region, in accordance with the method of manufacturing the semiconductor laser device of the first embodiment of the present invention.

FIG. 10 shows a relation between the thickness of $Zn_xO_y$ film 116 as the source of impurity diffusion formed in the region near the end surface of the laser resonator and the amount of wavelength shift of the peak wavelength of the window region to the lower wavelength side with respect to the peak wavelength of the active region. In FIG. 10, the abscissa represents the thickness (nm) of $Zn_xO_y$ film 116 as the source of impurity diffusion, and the ordinate represents the amount of wavelength shift (nm) with respect to the wavelength of the active region. As can be seen from FIG. 10, the wavelength of the window region is shifted by more than 30 nm to the side of lower wavelength with respect to the wavelength of the active region, when the thickness of the $Zn_xO_y$ film 116 is between 5 nm to 50 nm.

The reason for this may be the following. The $Zn_xO_y$ film as the source of impurity diffusion is a powder-like, near amorphous substance, and it has to be relatively thin and has to be sandwiched between the dielectric film containing Si atoms and a semiconductor film, to exhibit the function as an impurity diffusion source film. When the thickness of $Zn_xO_y$ film 116 exceeds 50 nm, the function as the impurity diffusion source film lowers, and when the thickness of $Zn_xO_y$ film 116 is thinner than 5 nm, Zn atoms existing in the impurity diffusion source film are insufficient, so that the Zn atoms cannot reach the window region 104B by annealing.

A maximum optical output test of a semiconductor laser device manufactured by the above described manufacturing method with the $Zn_xO_y$ film 116 having the thickness of 5 nm to 50 nm was performed, and no COD was generated at an optical output as high as 300 mW.

Thereafter, characteristics of the semiconductor laser device obtained by the above described manufacturing method in accordance with the present embodiment were measured. For comparison, characteristics of a third comparative semiconductor laser device (Comparative Example 3), for which annealing time was reduced from two hours to one hour so that Zn atoms were not diffused to window region 104B and only the Be atoms existed in the window region 104B, and a fourth comparative semiconductor laser device (Comparative Example 4) in which Be atoms concentration in the window region 104B is made lower than the Zn atoms concentration, with other aspects in accordance with the above described manufacturing method of the present embodiment, were also measured.

As a result, it was found that the oscillation wavelength of the semiconductor laser devices in accordance with the present embodiment and Comparative Example 3 was 655 nm and that of the semiconductor laser device of Comparative Example 4 was 650 nm, at the continuous wave CW of 50 mW. Driving current of the semiconductor laser devices in accordance with the present embodiment and Comparative Example 3 was 90 mA and that of the semiconductor laser device of Comparative Example 4 was 150 mA, at CW 50 mW. Further, by the maximum output test, it was found that no COD was generated in the semiconductor laser devices in accordance with the present embodiment and Comparative Example 3 even at the optical output as high as 300 mW, whereas COD was generated at 250 mW in the semiconductor laser device of Comparative Example 4. By a reliability test at an atmospheric temperature of 70° C. at 50 mA, it was found that the average life of the semiconductor laser device of Comparative Example 3 was 1000 hours, that of the Comparative Example 4 was 100 hours and that of the present embodiment was 2000 hours.

From the foregoing, it has been confirmed that the semiconductor laser device in accordance with the present embodiment having such a configuration in that the first impurity atoms (Be atoms) of the second conductivity and the second impurity atoms (Zn atoms) of the second conductivity exist mixedly in the MQW active layer (window region 104B) in the region near the end surface of the laser resonator and the first impurity atoms (Be atoms) exist in higher concentration than the second impurity atoms (Zn atoms) enables lower driving current and improved reliability over a long period of time. The lower driving current and the improved reliability over a long period of time are derived from the following. In the structure described above, diffusion of both the second impurity atoms (Zn atoms) and the first impurity atoms (Be atoms) is promoted to disorder the window region in the MQW active layer (window region 104B) in the region near the end surface of the laser resonator so that the annealing temperature can be made lower, and hence diffusion of the first impurity atoms (Be atoms) to the MQW active layer (active layer 104A) in the inner region of the laser resonator is suppressed.

Further, in the semiconductor laser device in accordance with the present embodiment having the structure in which concentration of the first impurity atoms (Be atoms concentration) is higher than concentration of the second impurity atoms (Zn atoms concentration) of the second conductivity, in the second clad layer (p type $Al_xGa_yIn_zP$ second clad layer 105) of the second conductivity type in the region near the end surface of the laser resonator and in the protective layer (p type GaAs protective layer 109) of the second conductivity type, it has been confirmed that shift of oscillation wavelength to the shorter wavelength side is suppressed and reliability over a long period of time is improved. Such suppression of shift to the shorter wavelength side and improvement in reliability over a long period of time derive from the following. In the structure described above, diffusion of the second impurity atoms (Zn atoms) of the second conductivity existing in the region near the end surface of the laser resonator into the inner region of the laser resonator is suppressed, and hence, disordering of the MQW active layer (active region 104A) and degradation in crystal characteristics in the inner region of the laser resonator by the second impurity atoms (Zn atoms) of the second conductivity are suppressed.

Further, it has been confirmed that the semiconductor laser device in accordance with the present embodiment having such a structure in that the first impurity atoms (Be atoms) of the second conductivity are the same as the impurity atoms contained in the second clad layer of the second conductivity type near said active layer enables lower driving current and improved reliability over a long period of time. Such lower driving current and improved reliability derive from the following. In the above described structure, in the region near the end surface of the laser resonator, the distance of diffusion of the first impurity atoms (Be atoms) of the second conductivity to the active layer can be made shorter, and as a result, it becomes possible to lower the annealing temperature. Thus, in the inner region of the laser resonator, diffusion of the first impurity atoms (Be atoms) exhibiting the second conductivity existing in the second clad layer of the second conductivity type to the active layer (active region 104A) can be suppressed.

Further, it has been confirmed that the semiconductor laser device in accordance with the present embodiment having such a structure in that the first clad layer (n type $Al_xGa_yIn_zP$ first clad layer 103) contains Si atoms enables lower driving current. The lower driving current derives from the following. Namely, Si atoms contained in the first clad layer of the first conductivity type (n type $Al_xGa_yIn_zP$ first clad layer 103) suppress diffusion of the first and second impurity atoms (Be and Zn atoms) of the second conductivity existing mixedly in the MQW active layer (window region 104B) in the region near the end surface of the laser resonator to the first clad layer (n type $Al_xGa_yIn_zP$ first clad layer 103) of the first conductivity, and hence, ineffective current in the MQW active layer (window region 104B) in the region near the end surface of the laser resonator is reduced.

Further, it has been confirmed that the semiconductor laser device in accordance with the present embodiment, in which the first impurity atoms of the second conductivity are Be atoms, enables lower driving current. Such lower driving current is attained by the fact that as the Be atoms having smaller diffusion coefficient with respect to the AlGaInP based material are used, diffusion to the MQW active layer (active region 104A) in the inner region of the laser resonator is suppressed at the time of annealing.

Further, it has been confirmed that the semiconductor laser device in accordance with the present embodiment, in which the second impurity atoms of the second conductivity type are Zn atoms, enables improved reliability over a long period of time. Such improvement in reliability over a long period of time derives from the fact that as Zn atoms having large diffusion coefficient with respect to the AlGaInP based material are used, the temperature of annealing performed for forming the window region can be made lower, diffusion of the first and second impurity atoms (Be atoms and Zn atoms) of the second conductivity to the MQW active layer (window region 104B) in the region near the end surface of the laser resonator is promoted, and generation of CODs is suppressed.

Further, improved reliability is confirmed in the method of manufacturing a semiconductor laser device in accordance with the present embodiment in which the film as a source of impurity diffusion containing the second impurity atoms of the second conductivity is $Zn_xO_y$ (x and y are numbers not smaller than 1). Such improved reliability over a long period of time derives from the fact that as the $Zn_xO_y$ (x and y are numbers not smaller than 1) film that is a powder-like and near amorphous substance is used, generation of stresses to epitaxially grown wafer caused by the difference in thermal expansion coefficient among various substances (crystals) can be suppressed at the time of annealing for forming the window region.

Though $Si_xO_y$ film 117 that contains Si and is thicker than the $Zn_xO_y$ film 116 as a source of impurity diffusion is used as a dielectric film, $Si_xN_y$ or $Si_xO_yN_z$ (x, y and z are numbers not smaller than 1, same in the following) may be used, as such film contains Si atoms that have the effect of suppressing diffusion of Zn atoms. Therefore, external diffusion of Zn atoms at the time of annealing (Zn atoms tunneling) can be suppressed, and the Zn atoms can efficiently be diffused to the active layer in the region near the end surface of the laser resonator. Thus, a desired semiconductor laser device can be obtained with good reproducibility.

In the present embodiment, the concentration of the second impurity atoms (Zn atoms) of the second conductivity existing mixedly in the MQW active layer (window region 104B) in the region near the end surface of the laser resonator was set to $8\times10^{16}$ atoms/cm$^3$. When the concentration of the second impurity atoms (Zn atoms) of the second conductivity mixedly existing in the MQW active layer (window region 104B) in the region near the end surface of the laser resonator is not higher than $1\times10^{16}$ atms/cm$^3$, diffusion of the first and second impurity atoms (Be atoms, Zn atoms) of the second conductivity into the MQW active layer (active region 104A) in the inner region of the laser resonator can be suppressed, whereas there is much variation in the amount of shift in the wavelength of MQW active layer (window region 104B) in the region near the end surface of the laser resonator, and hence the amount of shift in wavelength in the MQW active layer (window region 104B) in the region near the end surface of the laser resonator cannot be reproduced satisfactorily lot by lot. When the concentration of the second impurity atoms (Zn atoms) of the second conductivity mixedly existing as described above is $1\times10^{18}$ atoms/cm$^3$ or higher, it is possible to control the amount of shift in the wavelength of the MQW active layer (window region 104B) in the region near the end surface of the laser resonator, whereas the first and second impurity atoms (Be atoms and Zn atoms) of the second conductivity undesirably diffuse into the MQW active layer (active region 104A) in the inner region of the laser resonator, resulting in increased driving current. Therefore, by appropriately controlling the concentration of the second impurity atoms (Zn atoms) of the second conductivity mixedly existing in the MQW active layer (window region 104B) in the region near the end surface of the laser resonator in the range of $1\times10^{16}$ atoms/cm$^3$ to $1\times10^{18}$ atms/cm$^3$, it becomes possible to control the amount of shift in the wavelength of the MQW active layer (window region 104B) in the region near the end surface of the laser resonator caused by the second impurity atoms (Zn atoms) of the second conductivity, and the second impurity atoms (Zn atoms) of the second conductivity existing in the MQW active layer (active region 104B) in the region near the end surface of the laser resonator can be controlled not to be diffused into the MQW active layer (active region 104A) in the inner region of the laser resonator. Thus, the driving current can be reduced and the reliability over a long period of time can be improved.

In the present embodiment, current non-injection region 114 is formed by selectively removing p type $Ga_yIn_zP$ intermediate layer 108 and p type GaAs protective layer 109 in the region near the end surface of the laser resonator inside the ridge 115. It is noted, however, that n type $Al_xIn_zP$ current block layer 110 in the region near the end surface of the laser resonator formed on the ridge 115 may be used as the current non-injection region 114 to attain the similar effect as described above, as it prevents entrance of current to the window region and reduces ineffective current that does not contribute to emission of light.

Though one annealing is performed immediately after formation of $Zn_xO_y$ film 116 and $Si_xO_y$ film 117, a second annealing may be performed after the side surfaces of ridge 115 are filled by n type $Al_xIn_zP$ current block layer 110 by the second MBE method, whereby the Be atoms existing inside the ridge 115 may be activated and the reliability of the semiconductor laser device in accordance with the present embodiment over a long period of time can be improved.

Second Embodiment

Figure 11A:
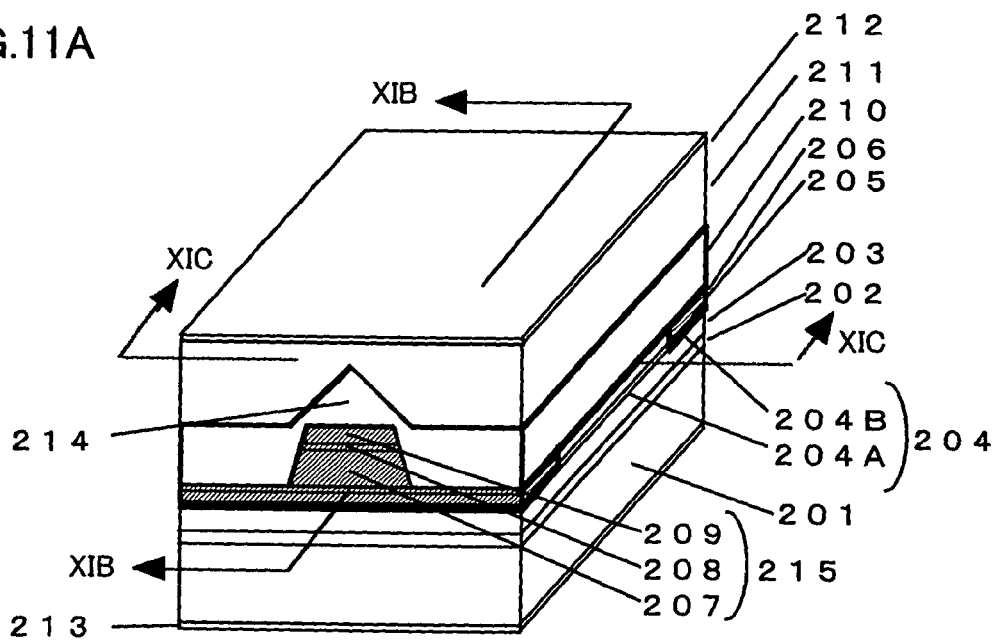
FIGS. 11A to 11C are schematic views representing a structure of a semiconductor laser device in accordance with a second embodiment of the present invention.
Figure 11B:
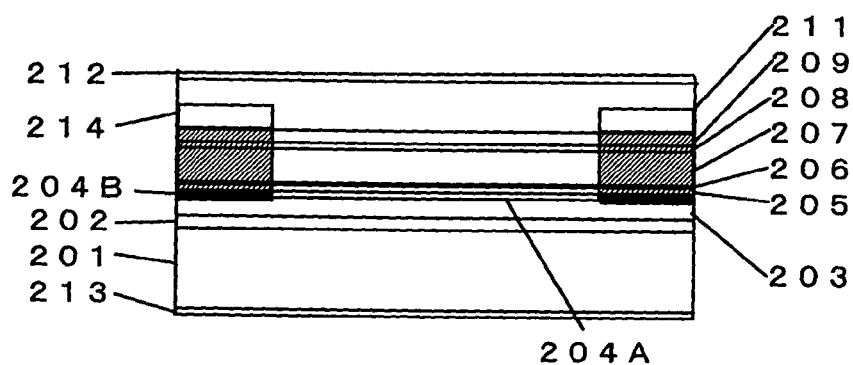
Figure 11C:
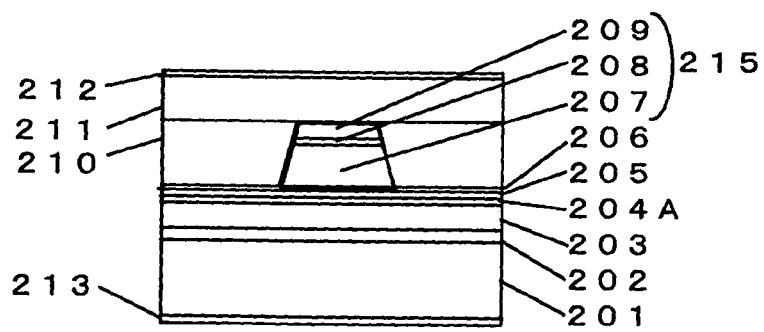

FIGS. 11A to 11C are schematic illustrations representing the structure of the semiconductor laser device in accordance with the second embodiment of the present invention. Here, FIG. 11A is a perspective view including the light emitting end surface, FIG. 11B is a cross section taken along the line XIB-XIB of FIG. 11A, and FIG. 11C is a cross section taken along the line XIC—XIC of FIG. 11A.

As shown in FIGS. 11A to 11C, in the semiconductor laser device in accordance with the present embodiment, on an n type GaAs substrate 201, an n type $Ga_yIn_zP$ (y and z are numbers of 0 to 1 satisfying the relation of y+z=1, same in the following) buffer layer 202, an n type $Al_xGa_yIn_zP$ (x, y and z are numbers of 0 to 1 satisfying the relation of x+y+z=1, same in the following) first clad layer 203, an MQW active layer (an active layer of multi-quantum well having a multi-quantum well structure with alternately stacked barrier and well layers sandwiched by optical guide layers) 204, a p type $Al_xGa_yIn_zP$ second clad layer 205 and a p type etching stop layer 206 stacked successively. On the p type etching stop layer 206, a p type $Al_xGa_yIn_zP$ third clad layer 207, a p type $Ga_yIn_zP$ intermediate layer 208 and a p type GaAs protective layer 209 are arranged in a ridge stripe shape along the resonator direction. An n type $Al_xIn_zP$ (x and z are numbers of 0 to 1 satisfying the relation of x+z=1, same in the following) current block (extruding) layer 210 is arranged to fill the sides of the p type $Al_xGa_yIn_zP$ third clad layer 207. On the p type GaAs protective layer 209 or n type $Al_xIn_zP$ current block layer 210, a p type GaAs contact layer 211 and a p side electrode 212 are arranged, and below the n type GaAs substrate 201, an n side electrode 213 is arranged.

Here, in the MQW active layer 204, the peak wavelength of photo luminescence of the window region (MQW active layer in the region near the end surface of the laser resonator) 204B is designed to be smaller than the peak wavelength of photo luminescence of the active region (MQW active layer in the inner region of the laser resonator) 204A. Further, on the p type GaAs protective layer 209 above the window region, a current non-injection region 214 formed of an n type $Al_xIn_zP$ current block layer 210 is provided. By the p type $Al_xGa_yIn_zP$ third clad layer 207, p type $Ga_yIn_zP$ intermediate layer 208 and p type GaAs protective layer 209, a stripe shaped ridge 215 to be a laser resonance wave guide path is formed.

Figure 12:
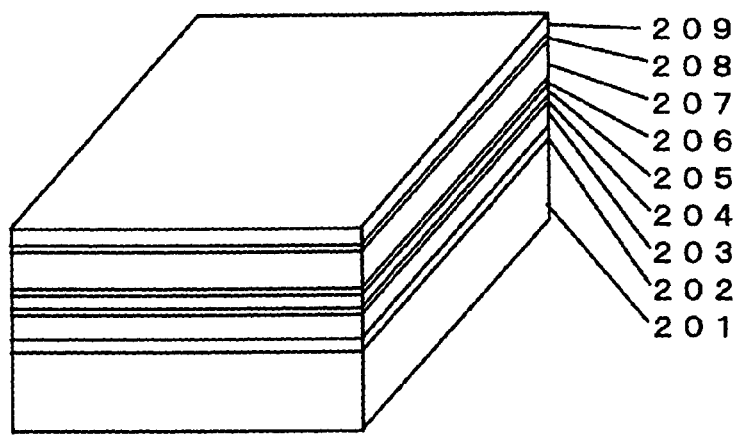
FIGS. 12 to 17 successively show process steps of manufacturing the semiconductor laser device in accordance with the second embodiment of the present invention.

FIGS. 12 to 17 show process steps of manufacturing the semiconductor laser device in accordance with the second embodiment of the present invention. First, as shown in FIG. 12, on n type GaAs substrate 201 (carrier concentration: $2\times10^{18}$ atoms/cm$^3$), n type $Ga_yIn_zP$ buffer layer 202 (carrier concentration: $1\times10^{18}$ atoms/cm$^3$), n type $Al_xGa_yIn_zP$ first clad layer 203 (carrier concentration: $1\times10^{18}$ atoms/cm$^3$), MQW active layer 204, p type $Al_xGa_yIn_zP$ second clad layer 205 (carrier concentration: $2\times10^{18}$ atoms/cm$^3$), p type etching stop layer 206 (carrier concentration: $2\times10^{18}$ atoms/cm$^3$), p type $Al_xGa_yIn_zP$ third clad layer 207 (carrier concentration: $2\times10^{18}$ atoms/cm$^3$), p type $Ga_yIn_zP$ intermediate layer 208 (carrier concentration: $5\times10^{18}$ atoms/cm$^3$), and p type GaAs protective layer 209 (carrier concentration: $1\times10^{19}$ atoms/cm$^3$) are grown successively by molecular beam epitaxy (MBE) method. Here, in each of n type GaAs substrate 201, n type $Ga_yIn_zP$ buffer layer 202 and n type $Al_xGa_yIn_zP$ first clad layer 203, Si atoms are contained as carrier atoms, while in each of p type $Al_xGa_yIn_zP$ second clad layer 205, p type etching stop layer 206, p type $Al_xGa_yIn_zP$ third clad layer 207, p type $Ga_yIn_zP$ intermediate layer 208 and p type GaAs protective layer 209, Be atoms of p type conductivity are contained as carrier atoms.

Figure 13:
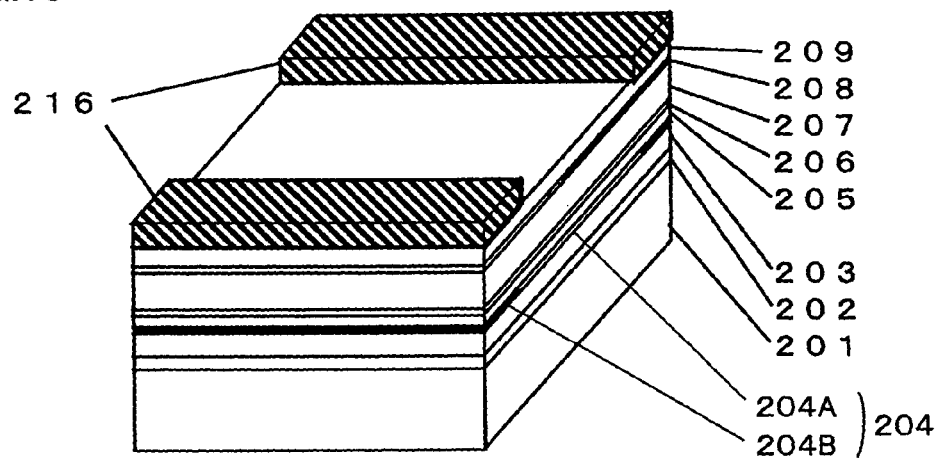

Thereafter, as shown in FIG. 13, on the surface of p type GaAs protective layer 209 in the region near the end surface of the laser resonator, an $Zn_xSi_yO_z$ (x, y and z are numbers not smaller than 1, same in the following) film 216 as a source of impurity diffusion in a stripe shape having the width of 60 μm and the thickness of 35 nm is formed in a direction orthogonally crossing the ridge stripe, using common photolithography technique. The pitch of the stripes of $Zn_xSi_yO_z$ film 216 is set to 800 μm, that is the same as the resonator length.

Then, the wafer having the $Zn_xSi_yO_z$ film 216 formed thereon is annealed under the same condition as in the first embodiment (in a nitrogen atmosphere at a temperature of 510° C. for a holding time of 2 hours), so as to diffuse the Zn atoms contained in the $Zn_xSi_yO_z$ film 216 to the MQW active layer 204 and to simultaneously diffuse Be atoms contained in each of p type $Al_xGa_yIn_zP$ second clad layer 205, p type etching stop layer 206, p type $Al_xGa_yIn_zP$ third clad layer 207, p type $Ga_yIn_zP$ intermediate layer 208 and p type GaAs protective layer 209 to MQW active layer 204, whereby the peak wavelength of photo luminescence of window region (MQW active layer in the region near the end surface of the laser resonator) 204B is made smaller than the peak wavelength of photo luminescence of active region (MQW active layer in the inner region of the laser resonator) 204A.

Figure 14:
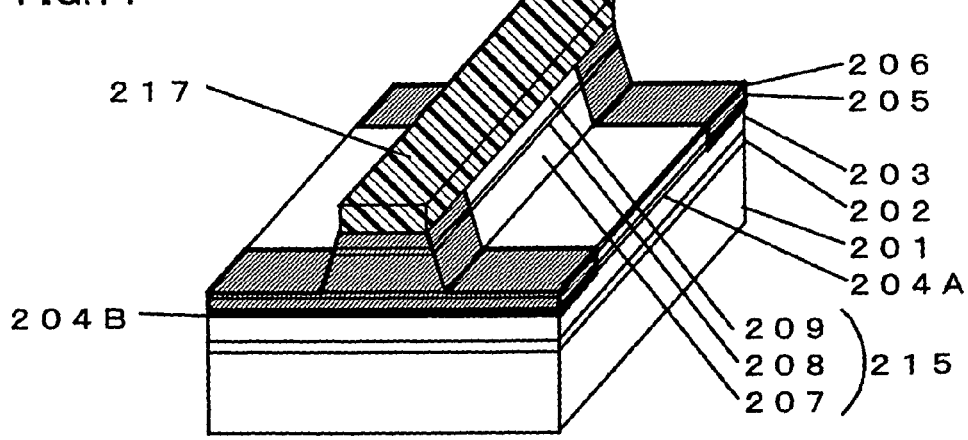

Thereafter, referring to FIG. 14, $Zn_xSi_yO_z$ film 216 formed on p type GaAs protective layer 209 is removed, and using known photolithography technique, a stripe shaped resist mask 217 extending in a direction vertical to the end surface of the laser resonator is formed on p type GaAs protective layer 209, and using known etching technique, p type GaAs protective layer 209, p type $Ga_yIn_zP$ intermediate layer 208 and p type $Al_xGa_yIn_zP$ third clad layer 207 are processed to a stripe shaped ridge 215 having the width of about 3 μm, to reach the p type etching stop layer 206.

Figure 15:
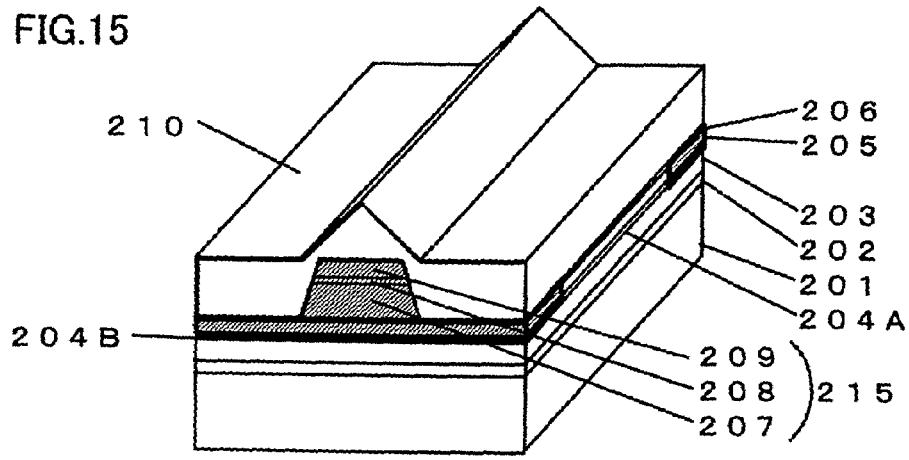

Then, stripe shaped resist mask 217 formed on p type GaAs protective layer 209 is removed, and as shown in FIG. 15, by the second MBE method, side surfaces of ridge 215 formed of p type $Al_xGa_yIn_zP$ third clad layer 207, p type $Ga_yIn_zP$ intermediate layer 208 and p type GaAs protective layer 209 are filled by n type $Al_xIn_zP$ current block layer 210.

Figure 16:
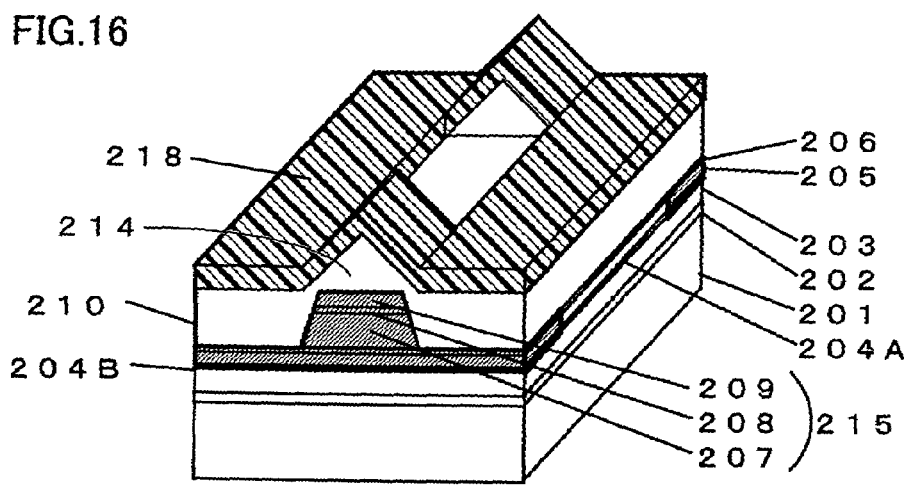

Thereafter, referring to FIG. 16, using known photolithography technique, on n type $Al_xIn_zP$ current block layer 210 formed on the side surfaces of ridge 215 and on the region near the end surface of the laser resonator in the stripe shape having the width of 60 μm of n type $Al_xIn_zP$ current block layer 210 formed on the ridge 215, a resist mask 218 is formed, and using known etching technique, n type $Al_xIn_zP$ current block layer 210 at the opening of resist mask 218 is selectively removed.

In the method of manufacturing the semiconductor laser device in accordance with the present embodiment, the step of removing n type $Al_xIn_zP$ current block layer 210 formed on ridge 215 also serves as the step of forming the current non-injection region 214, and therefore, the number of process steps can be reduced. Further, as the current non-injection region 214 formed by this process is positioned immediately above the window region 204B, entrance of current to the window region can be prevented, and carrier loss at the window region is suppressed. Thus, ineffective current that does not contribute to light emission can be reduced.

Figure 17:
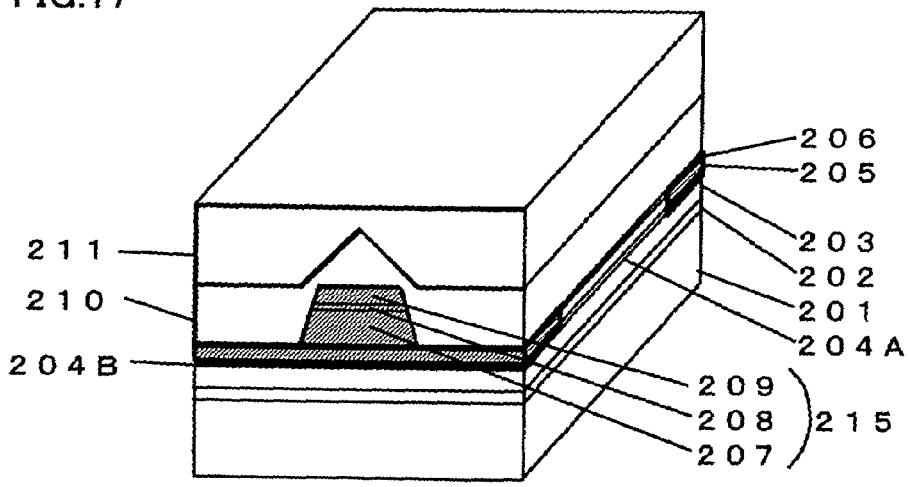
Figure 18A:
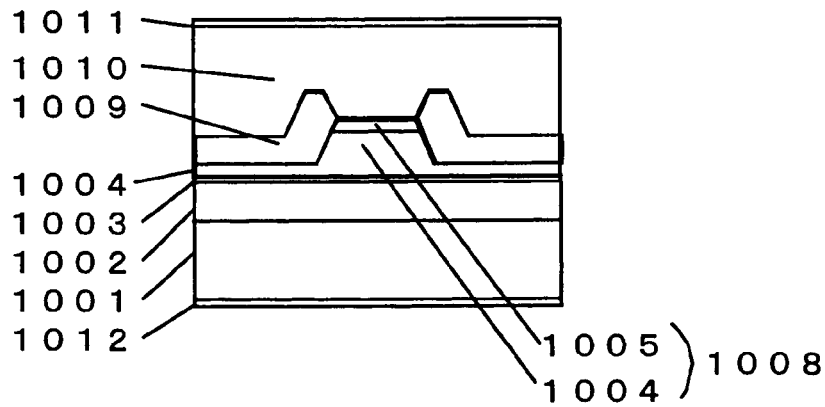
FIGS. 18A to 18C are schematic views representing a structure of a conventional semiconductor laser device having a window structure.
Figure 18B:
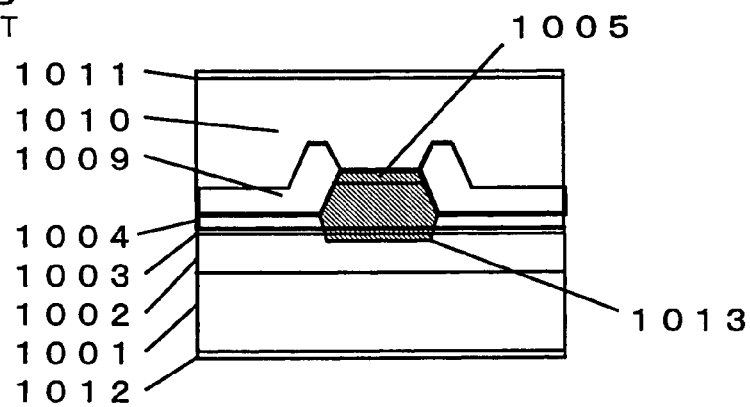
Figure 18C:
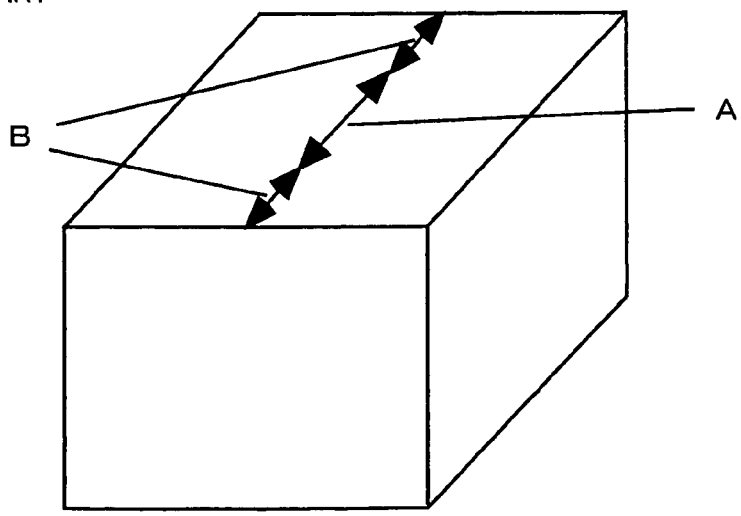
Figure 19:
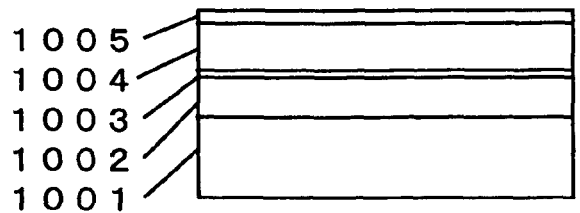
FIGS. 19 to 22 successively show process steps of manufacturing the conventional semiconductor laser device having a window structure.
Figure 20:
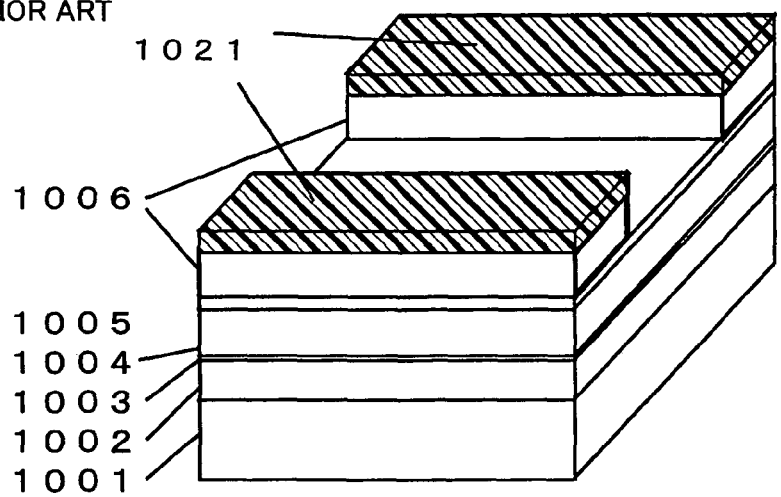
Figure 21:
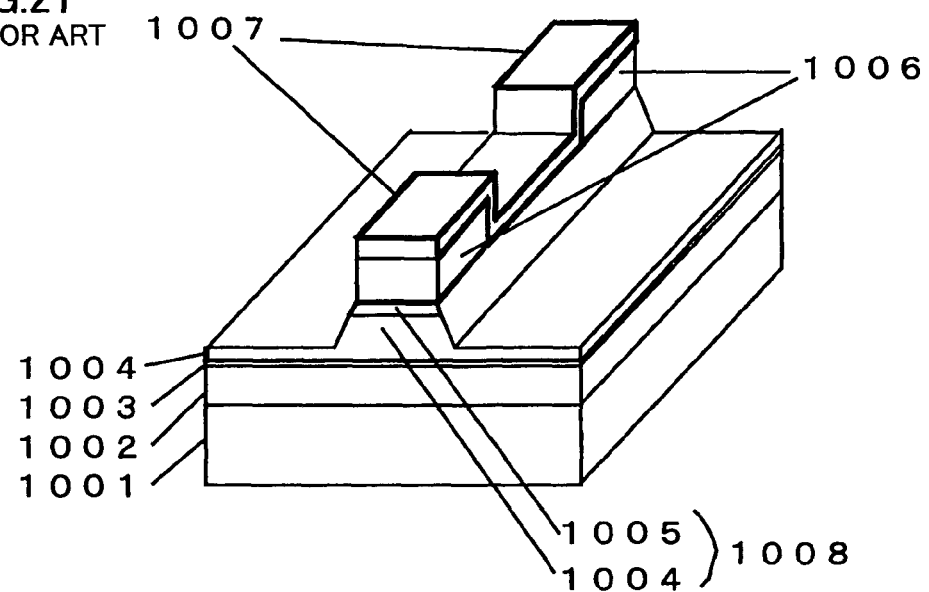
Figure 22:
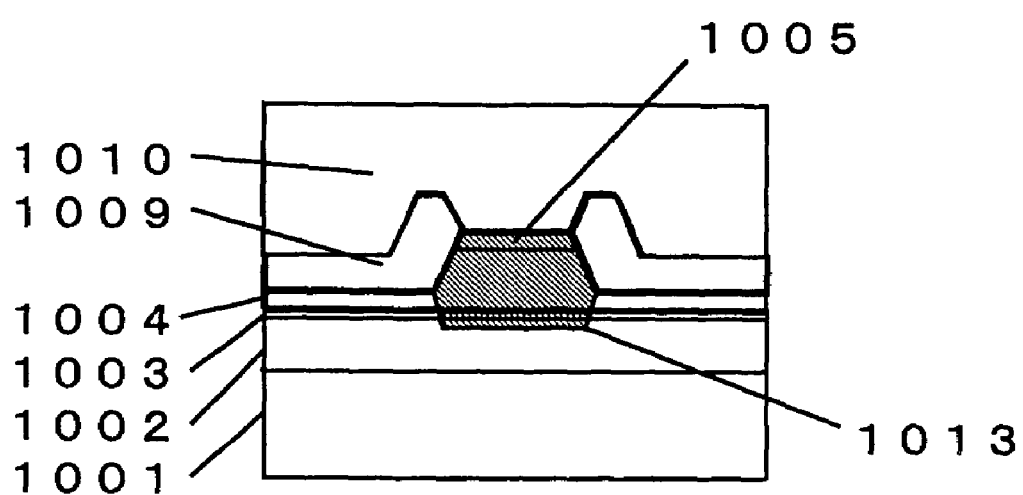

Thereafter, resist mask 218 formed on the inner region of the laser resonator is removed and, as shown in FIG. 17, p type GaAs contact layer 211 is formed by the third MBE method. Further, p electrode 212 is formed on the upper surface and n electrode 213 is formed on the lower surface of the wafer.

Next, approximately at the center of the region near the end surface of the laser resonator having the width of 60 μm, a scribe line is formed and the body is divided to a bar having the length of the resonator. Finally, light emitting surfaces on both sides of the bar are coated with a reflective film, and the bar is divided into chips. Thus, a semiconductor laser device is completed, which has a current non-injection region and a window region of about 30 μm at an end surface portion of the laser resonator, the resonator having the length of 800 μm.

Concentration distribution in the depth direction of Be atoms and Zn atoms in a region near the end surface of a laser resonator in the ridge of the semiconductor laser device in accordance with the present embodiment obtained after the end of the step shown in FIG. 13 and annealing in accordance with the present embodiment was measured by secondary ion-mass spectrography (SIMS). It was found that Be atoms and Zn atoms existed mixedly in the window region 204B, and concentration of Zn atoms was $2\times10^{17}$ atoms/cm$^3$. Further, in each of the layers from window region 204B to p type GaAs protective layer 209, it was confirmed that Be atoms existed at a higher concentration than Zn atoms.

Specifically, it has been confirmed that by the manufacturing method described above, it becomes possible to realize co-existence of the first impurity atoms (Be atoms) having the second conductivity and the second impurity atoms (Zn atoms) having the second conductivity in the window region 204B and to make concentration of the first impurity atoms (Be atoms) having the second conductivity higher than that of the second impurity atoms (Zn atoms) having the second conductivity.

Further, it has been confirmed that by using the manufacturing method described above, it becomes possible to make concentration of the first impurity atoms (Be atoms) having the second conductivity higher than that of the second impurity atoms (Zn atoms) having the second conductivity in the second clad layer of the second conductivity type (p type $Al_xGa_yIn_zP$ second clad layer 205) and the protective layer of the second conductivity type (p type GaAs protective layer 209) in the region near the end surface of the laser resonator.

Further, it has been confirmed that by using the manufacturing method described above, it becomes possible to suppress diffusion of the first impurity atoms (Be atoms) of the second conductivity existing in the second clad layer of the second conductivity type (p type $Al_xGa_yIn_zP$ second clad layer 205) in the inner region of the laser resonator to the active layer.

Using PL method, wavelength of the window region 204B and active region 204A was measured, of a part of a wafer obtained after the end of the step shown in FIG. 13 and annealing, in accordance with the method of manufacturing the semiconductor laser device in accordance with the present embodiment.

For comparison, using a wafer in which $Zn_xO_y$ film 116 was formed in the region near the end surface of the laser resonator and $Si_xO_y$ film 117 was formed thereon in accordance with the method of manufacturing the semiconductor laser device of the first embodiment, after the step of FIG. 3 and annealing, the wavelength of the window region 104B and active region 104A was measured, similarly by the PL method.

As a result, it was found that the emission spectrum from the window region 204B in accordance with the present embodiment was shifted from the emission spectrum from the active region 204A by 50 nm to the shorter wavelength side. Further, it was found that the emission spectrum from the window region 104B in accordance with the first embodiment was shifted from the emission spectrum from the active region 104A by 38 nm to the shorter wavelength side.

From the foregoing, it has been confirmed that, under the same annealing condition, when the above described manufacturing method is used that includes the step of forming a $Zn_xSi_yO_z$ film 216 containing the second impurity atoms (Zn atoms) of the second conductivity and Si atoms in a region near the end surface of the laser resonator, it becomes possible to simplify the process steps, to suppress external diffusion (tunneling) of Zn atoms at the time of annealing and to promote diffusion to the window region 204B, and hence it becomes possible to make the peak wavelength of photo luminescence of the window region 204B sufficiently smaller than the peak wavelength of photo luminescence of active region 204A.

Characteristics of the semiconductor laser device formed in accordance with the manufacturing method of the present embodiment were measured. For comparison, characteristics of a semiconductor laser device manufactured in accordance with the method of the first embodiment in which the $Zn_xO_y$ film 116 was formed in the region near the end surface of the laser resonator and $Si_xO_y$ film 117 was formed thereon were also measured simultaneously.

As a result, it was found that the oscillation wavelengths of the present embodiment and the first embodiment at CW 50 mW were both 655 nm, and driving currents (Iop) of the present embodiment and the first embodiment at CW 50 mW were both 90 mA.

From the results of maximum output test, it was found that the semiconductor laser devices in accordance with the present embodiment and the first embodiment were both free of any COD at an optical output as high as 300 mW or higher. Reliability test of these devices at 70° C. and 50 mW was performed, and it was found that the semiconductor laser device in accordance with the first embodiment had the average life of 2000 hours and the semiconductor device in accordance with the present embodiment had the average life of 3000 hours, that is, 1.5 times longer. Thus, it has been confirmed that the semiconductor laser devices manufactured by the method of the present embodiment having the step of forming a $Zn_xSi_yO_z$ film containing the second impurity atoms (Zn atoms) of the second conductivity and Si atoms in the region near the end surface of the laser resonator enables further improvement of reliability over a long period of time.

In the present embodiment, the concentration of the second impurity atoms (Zn atoms) of the second conductivity existing mixedly in the window region 204B was set to $2\times10^{17}$ atoms/cm$^3$. By appropriately controlling the concentration of the second impurity atoms (Zn atoms) of the second conductivity mixedly existing in the window region 204B in the range of $1\times10^{16}$ atoms/cm$^3$ to $1\times10^{18}$ atms/cm$^3$, it becomes possible to control the amount of shift in the wavelength of the window region 204B caused by the second impurity atoms (Zn atoms) of the second conductivity, and the second impurity atoms (Zn atoms) of the second conductivity existing in the active region 204B can be controlled not to be diffused into the active layer (active region 204A) in the inner region of the laser resonator. Thus, the driving current can be reduced and the reliability over a long period of time can be improved.

In the present embodiment, at the time of annealing, no film is formed on the p type GaAs protective layer 209 in the inner region of the laser resonator. It is noted, however, that similar effects as described above can be attained when a dielectric film such as $Al_xO_y$, $Si_xO_y$, $Si_xN_y$ or $Si_xO_yN_z$ is formed on p type GaAs protective layer 209 in the inner region of the laser resonator.

In the present embodiment, n type $Al_xIn_zP$ current block layer 210 in the region near the end surface of the laser resonator formed on the ridge 215 is used as the current non-injection region 214. It is noted, however, that a current non-injection region formed by selectively removing p type $Ga_yIn_zP$ intermediate layer 208 and p type GaAs protective layer 209 in the region near the end surface of the laser resonator inside the ridge 215 may be used to attain the similar effect as described above, as it prevents entrance of current to the window region and reduces ineffective current not contributing to emission of light.

Though one annealing is performed immediately after formation of $Zn_xSi_yO_z$ film 216, a second annealing may be performed after the side surfaces of ridge 215 is filled by n type $Al_xIn_zP$ current block layer 210 by the second MBE method, whereby the Be atoms existing inside the ridge 215 may be activated and the reliability of the semiconductor laser device in accordance with the present embodiment over a long period of time can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, comprising:
    a semiconductor substrate;
    a first clad layer of a first conductivity type;
    an active layer;
    a second clad layer of a second conductivity type; and
    a protective layer of the second conductivity type; wherein
    peak wavelength of photo luminescence in the active layer in a region near an end surface of a laser resonator is smaller than peak wavelength of photo luminescence of the active layer in an inner region of the laser resonator; and
    first impurity atoms of a second conductivity and second impurity atoms of the second conductivity exist mixedly in said active layer in the region near the end surface of the laser resonator, with concentration of said first impurity atoms being higher than that of the second impurity atoms.

2. The semiconductor laser device according to claim 1, wherein
    in said second clad layer in the region near the end surface of the laser resonator and in said protective layer also, first impurity atoms of the second conductivity and second impurity atoms of the second conductivity exist with the concentration of said first impurity atoms being higher than that of the second impurity atoms.

3. The semiconductor laser device according to claim 1, wherein concentration of the second impurity atoms in the active layer in the region near the end surface of the laser resonator is at least $1 \times 10^{16}$ atoms/cm$^3$ and at most $1 \times 10^{18}$ atoms/cm$^3$.

4. The semiconductor laser device according to claim 1, wherein
    the first impurity atoms are the same as the impurity atoms contained in the second clad layer near the active layer.

5. The semiconductor laser device according to claim 1, wherein
    said first clad layer contains Si atoms.

6. The semiconductor laser device according to claim 1, wherein
    said semiconductor substrate contains GaAs, and a semiconductor layer stacked on said semiconductor substrate contains an AlGaInP based material.

7. The semiconductor laser device according to claim 1, wherein
    the first impurity atoms are Be atoms.

8. The semiconductor laser device according to claim 1, wherein
    the second impurity atoms are Zn or Mg atoms.

* * * * *